(12) United States Patent
Mazzillo et al.

(10) Patent No.: US 12,294,035 B2
(45) Date of Patent: *May 6, 2025

(54) HETEROSTRUCTURE OPTOELECTRONIC DEVICE FOR EMITTING AND DETECTING ELECTROMAGNETIC RADIATION, AND MANUFACTURING PROCESS THEREOF

(71) Applicant: STMicroelectronics S.r.l., Agrate Brianza (IT)

(72) Inventors: Massimo Cataldo Mazzillo, Corato (IT); Valeria Cinnera Martino, Valverde (IT); Antonella Sciuto, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 752 days.

This patent is subject to a terminal disclaimer.

(21) Appl. No.: 17/357,653

(22) Filed: Jun. 24, 2021

(65) Prior Publication Data

US 2021/0320219 A1 Oct. 14, 2021

Related U.S. Application Data

(63) Continuation of application No. 16/535,026, filed on Aug. 7, 2019, now Pat. No. 11,049,990.

(30) Foreign Application Priority Data

Aug. 8, 2018 (IT) .......................... 102018000007970

(51) Int. Cl.
*H01L 31/12* (2006.01)
*H01L 31/0376* (2006.01)
(Continued)

(52) U.S. Cl.
CPC ........ *H01L 31/12* (2013.01); *H01L 31/03762* (2013.01); *H01L 31/107* (2013.01);
(Continued)

(58) Field of Classification Search
None
See application file for complete search history.

(56) References Cited

U.S. PATENT DOCUMENTS 4,605,943 A * 8/1986 Nakamura ............... H01L 31/12
257/E31.095
4,614,958 A 9/1986 Mikami et al.
(Continued)

FOREIGN PATENT DOCUMENTS

JP 59-129468 A 7/1984

OTHER PUBLICATIONS

Hashimoto et al., "*High Performance AlGaAs Visible (700 nm) LED on Si Substrate Prepared by MOCVD*," Washington, DC, USA, Dec. 1-4, 1985, 4 pages.
Ossicini et al., *Light Emitting Silicon for Microphotonics*, Springer, Berlin, 2003, pp. 1-36, "1 Introduction: Fundamental Aspects," 48 pages.
(Continued)

*Primary Examiner* — Robert K Carpenter
(74) *Attorney, Agent, or Firm* — Seed IP Law Group LLP

(57) ABSTRACT

An optoelectronic device with a semiconductor body that includes: a bottom cathode structure, formed by a bottom semiconductor material, and having a first type of conductivity; and a buffer region, arranged on the bottom cathode structure and formed by a buffer semiconductor material different from the bottom semiconductor material. The optoelectronic device further includes: a receiver comprising a receiver anode region, which is formed by the bottom semiconductor material, has a second type of conductivity, and extends in the bottom cathode structure; and an emitter, which is arranged on the buffer region and includes a semiconductor junction formed at least in part by a top (Continued)

semiconductor material, different from the bottom semiconductor material.

20 Claims, 26 Drawing Sheets

(51) Int. Cl.
*H01L 31/107* (2006.01)
*H01L 31/18* (2006.01)
*H01L 33/00* (2010.01)
*H01L 33/06* (2010.01)
*H01L 33/12* (2010.01)
*H01L 33/32* (2010.01)
*H01L 33/34* (2010.01)

(52) U.S. Cl.
CPC ........ *H01L 31/1848* (2013.01); *H01L 33/007* (2013.01); *H01L 33/06* (2013.01); *H01L 33/12* (2013.01); *H01L 33/325* (2013.01); *H01L 33/34* (2013.01)

(56) References Cited

U.S. PATENT DOCUMENTS

| | | |
|---|---|---|
| 5,099,299 A | 3/1992 | Fang |
| 5,140,152 A | 8/1992 | Van Zeghbroeck |
| 11,049,990 B2 * | 6/2021 | Mazzillo ................. H01L 33/12 |
| 2005/0083567 A1 | 4/2005 | Chun Liu et al. |
| 2014/0339398 A1 | 11/2014 | Mazzillo et al. |
| 2015/0372181 A1 | 12/2015 | Kobayashi et al. |
| 2017/0084775 A1 | 3/2017 | Li et al. |

OTHER PUBLICATIONS

Cooke, "*Expanding interest in cubic silicon carbide on silicon substrates,*" Semiconductor Today, Compounds and Advanced Silicon, vol. 9, Issue 10, Dec. 2014/Jan. 2015, 4 pages.

Geum et al. "*Ultra-high-throughput Production of III-V/Si Wafer for Electronic and Photonic Applications,*" Scientific Reports, Feb. 11, 2016, 10 pages.

Fuchs et al. "*Silicon carbide light-emitting diode as a prospective room temperature source for single photons,*" https://www.nature.com/articles/srep01637, download date Oct. 9, 2017, 12 pages.

* cited by examiner

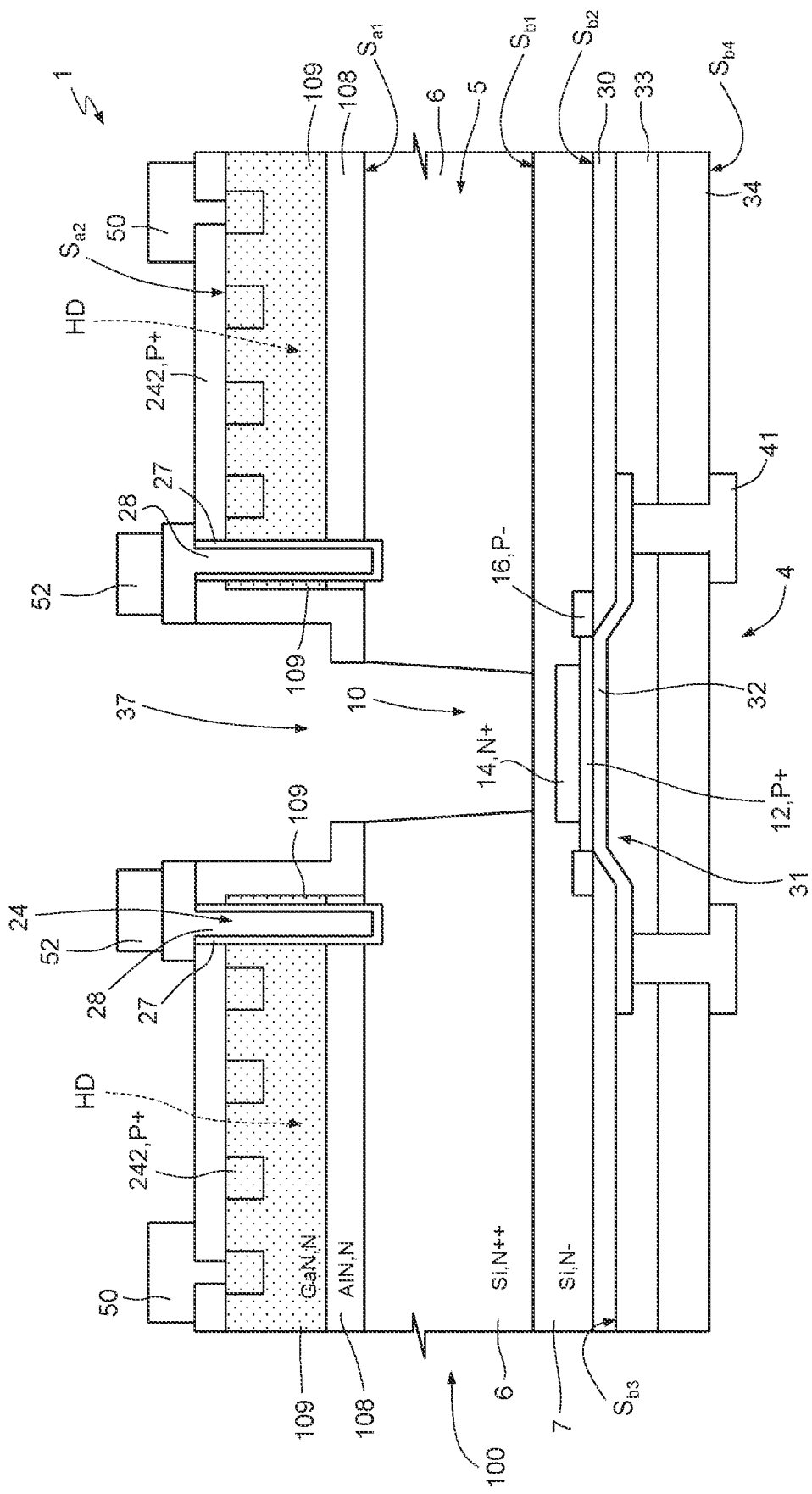

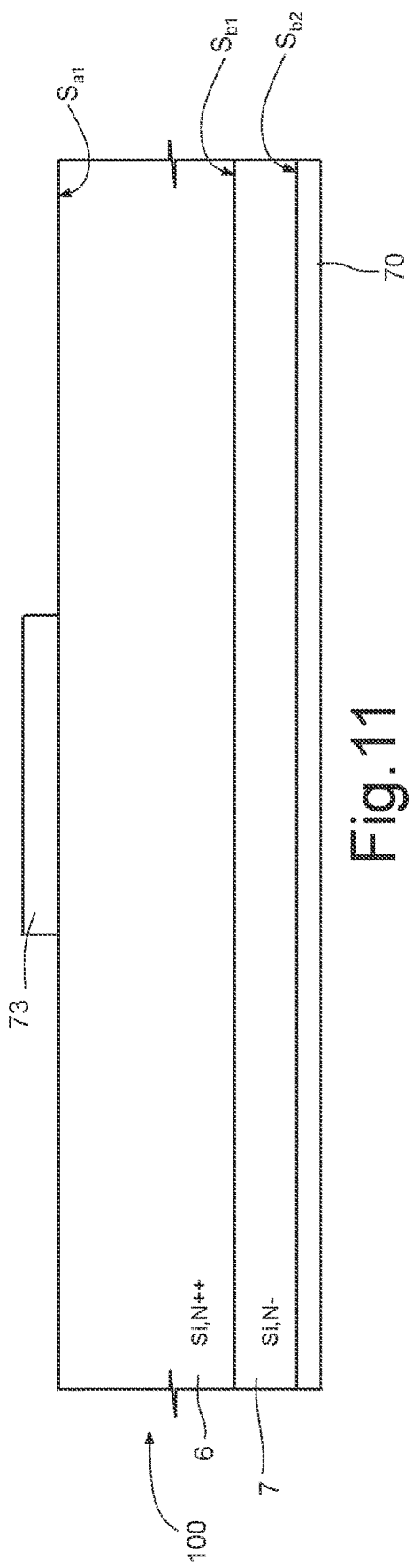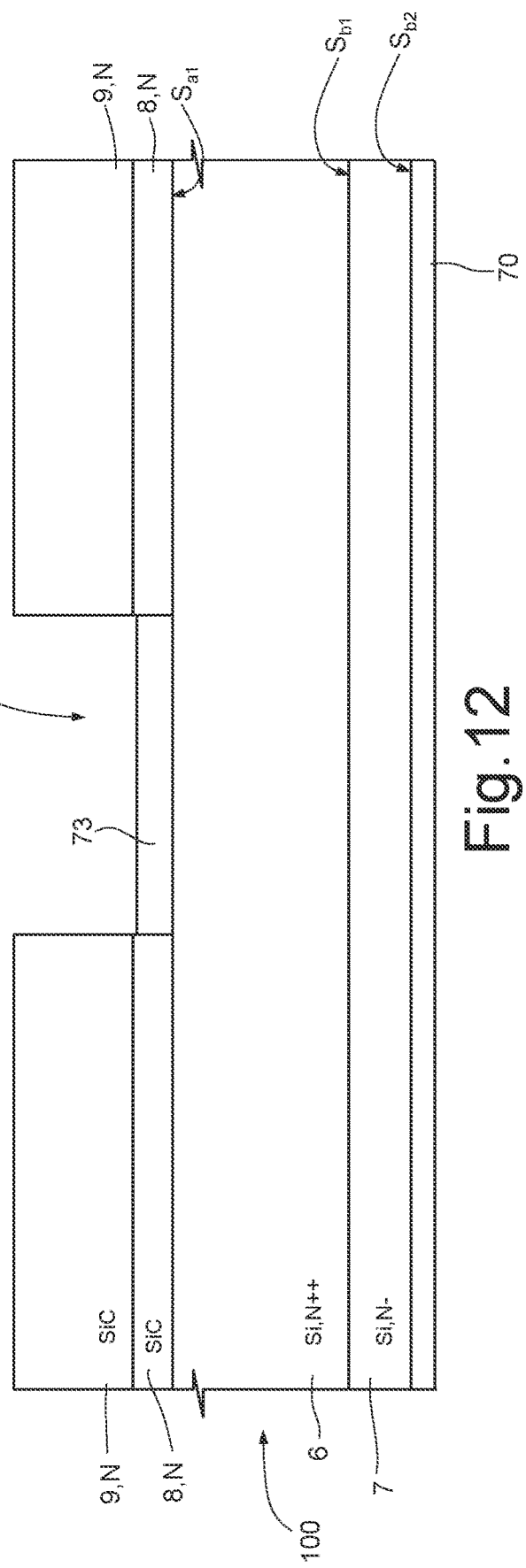

HETEROSTRUCTURE OPTOELECTRONIC DEVICE FOR EMITTING AND DETECTING ELECTROMAGNETIC RADIATION, AND MANUFACTURING PROCESS THEREOF

BACKGROUND

Technical Field

The present disclosure relates to a heterostructure optoelectronic device for emitting and detecting electromagnetic radiation, as well as to the manufacturing process thereof.

Description of the Related Art

As is known, a new frontier of research is in the development of non-classic light sources, such as low-power sources that are able to produce flows of photons with controllable emission rate, fast decay (a few nanoseconds), and a clearly defined spectral bandwidth. In particular, robust and inexpensive light sources that are able to emit single photons on demand are at the center of many highly demanding optical technologies.

Single-photon sources present particular and advantageous space-time characteristics and characteristics of chromaticity, thanks to their capacity of emitting a few photons (down to a single photon) at each burst, with a short lifetime (of the order of nanoseconds), appreciable radiating power even in the presence of low electrical and/or optical excitation, low power consumption, narrow emission band at short wavelengths (including an emission band in the infrared), and operation even at room temperature. Moreover, increasingly numerous are applications that could benefit from the presence of devices with a single-photon source, such as low-power proximity sensors.

This having been said, there have been proposed single-photon light-emitter (SPLE) devices formed in dice made of semiconductor material with wide band gap, i.e., with a value of the band gap greater than or equal to 2.3 eV, such as silicon carbide (SiC), gallium nitride (GaN), or diamond. However, proposed SPLE devices are still characterized by a reduced miniaturization, as well as by the absence of integration with the far more widespread silicon photodetectors, such as Geiger-mode avalanche photodiodes, also known as single-photon avalanche diodes (SPADs), described, for example, in the US patent application 2014/0339398.

More in general, the problem of integrating high-efficiency semiconductor emitters and receivers, respectively for emission and detection, is particularly felt even in the case of emitters of a non-SPLE type. In fact, currently the most efficient semiconductor emitters and receivers are made of different semiconductor materials.

BRIEF SUMMARY

An aim of the present disclosure is hence to provide an optoelectronic device that will overcome at least in part the drawbacks of the prior art.

According to the present disclosure an optoelectronic device is provided.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIGS. 1 and 3-8 are schematic cross-sectional views of embodiments of the present optoelectronic device;

FIGS. 9-20 are schematic cross-sectional views of the device illustrated in FIG. 6, during successive steps of a manufacturing process.

DETAILED DESCRIPTION

Figure 1:
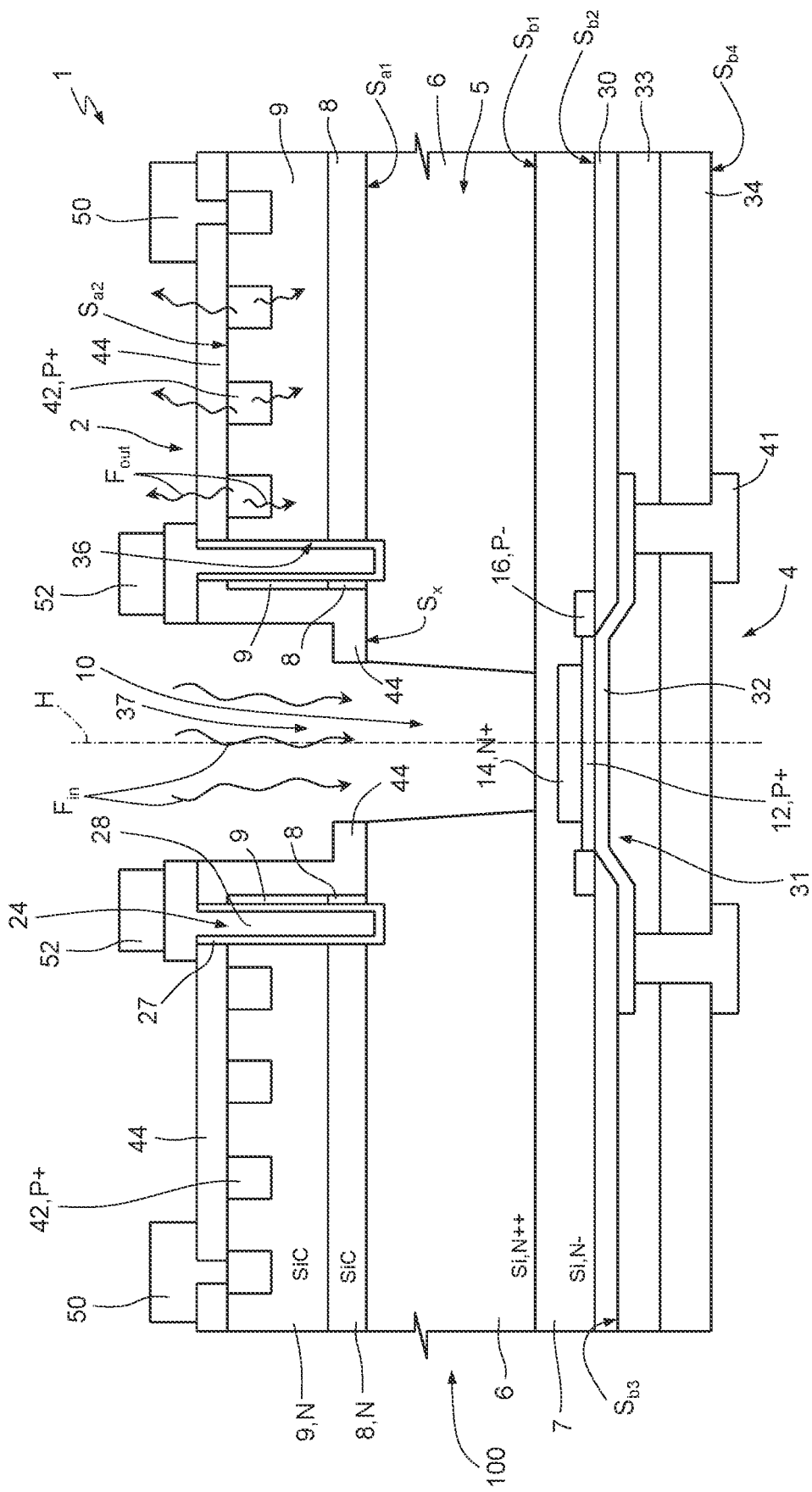

FIG. 1 (which is not in scale, as neither are the subsequent figures) shows an optoelectronic device 1, which is formed in a die of semiconductor material and comprises an emitter 2 and a receiver 4.

In detail, the optoelectronic device 1 comprises a semiconductor body 5, which in turn comprises a silicon substrate 6 having a first top surface $S_{a1}$ and a first bottom surface $S_{b1}$. Moreover, the semiconductor body 5 comprises a bottom epitaxial layer 7, which is made of silicon and extends underneath the first bottom surface $S_{b1}$.

For instance, the substrate 6 is of an N++ type, has a thickness, for example, of between 300 μm and 500 μm, and has a doping level, for example, of between $1 \cdot 10^{19}$ cm$^{-3}$ and $1 \cdot 10^{20}$ cm$^{-3}$.

The bottom epitaxial layer 7 is of an N− type, has a thickness, for example, of between 5 μm and 7 μm and has a doping level, for example, of between $1 \cdot 10^{14}$ cm$^{-3}$ and $5 \cdot 10 \cdot$ cm$^{-3}$. The bottom epitaxial layer 7 is delimited underneath by a second bottom surface $S_{b2}$.

Extending through the substrate 6 is a first cavity 10, which extends between the first top surface Sa1 and the first bottom surface $S_{b1}$ so as to leave a portion of the latter exposed. Assuming an axis H perpendicular to the first top surface Sa1 and the first bottom surface $S_{b1}$, the first cavity 10 has, for example, a frustoconical shape, with an axis that coincides with the axis H and with its hypothetical apex facing downwards.

The semiconductor body 5 further comprises an anode region 12, of a P+ type, and has a circular or polygonal (for example, quadrangular) shape in top plan view. For reasons that will be clear later, in what follows the anode region 12 is referred to as "receiver anode region 12".

In detail, the receiver anode region 12 is made of silicon and extends in a bottom portion of the bottom epitaxial layer 7, starting from the second bottom surface $S_{b2}$. Moreover, the receiver anode region 12 has a thickness, for example, of between 0.05 μm and 0.4 μm, and has a doping level, for example, of between $5 \cdot 10^{18}$ cm$^{-3}$ and $5 \cdot 10^{19}$ cm$^{-3}$.

Likewise extending in the bottom epitaxial layer 7 is an enriched region 14, made of silicon of an N+ type. In particular, the enriched region 14 extends over the receiver anode region 12 and in direct contact with the latter. Moreover, the enriched region 14 has a thickness, for example, of 0.5 μm and a doping level, for example, of between $1 \cdot 10^{17}$ cm$^{-3}$ and $5 \cdot 10^{17}$ cm$^{-3}$.

Without this implying any loss of generality, the receiver anode region 12 is vertically aligned to the first cavity 10. In particular, in the case where the receiver anode region 12 has a symmetrical shape, the axis of symmetry of the receiver anode region 12 may coincide with the axis H.

The semiconductor body 5 further comprises a guard ring 16, made of silicon of a P− type and with a doping level of between $1 \cdot 10^{16}$ cm$^{-3}$ and $3 \cdot 10^{16}$ cm$^{-3}$. In particular, the guard ring 16 extends in the bottom epitaxial layer 7, giving out onto the second bottom surface $S_{b2}$. Moreover, the guard ring 16 has a hollow shape and is arranged so as to surround laterally the receiver anode region 12, with which it is in direct contact. Moreover, the guard ring 16 has a thickness, for example, of between 1 µm and 4 µm.

The optoelectronic device 1 further comprises a first bottom dielectric region 30, which extends underneath the bottom epitaxial layer 7, in contact with the second bottom surface $S_{b2}$.

The first bottom dielectric region 30 is made of TEOS oxide and is in the form of a layer, in which a recess 31 is formed, as described in greater detail hereinafter. This layer has a thickness, for example, of 1 µm and is delimited underneath by a third bottom surface $S_{b3}$. Moreover, the recess 31 extends underneath the receiver anode region 12. The receiver anode region 12 is hence arranged at a distance from the first bottom dielectric region 30. In other words, whereas the receiver anode region 12 gives out onto a central portion of the second bottom surface $S_{b2}$, the first bottom dielectric region 30 extends in contact with a peripheral portion of the second bottom surface $S_{b2}$. In addition, the first bottom dielectric region 30 contacts the guard ring 16.

In greater detail, the recess 31 has, for example, a frustoconical shape with an axis coincident with the axis H and with a hypothetical apex facing upwards.

The optoelectronic device 1 further comprises a region 32, referred to hereinafter as "intermediate region 32".

In detail, the intermediate region 32 is made, for example, of polysilicon, is of a P+ type, has a doping level, for example, of between $1 \cdot 10^{20}$ cm$^{-3}$ and $3 \cdot 10^{20}$ cm$^{-3}$ and has a thickness, for example, of between 50 nm and 100 nm. Moreover, the intermediate region 32 includes a central portion, which extends underneath the receiver anode region 12, with which it is in direct contact, and coats the recess 31 at the top and laterally. Without this implying any loss of generality, the intermediate region 32 further includes a respective peripheral portion, which extends underneath the third bottom surface $S_{b3}$.

Once again without this implying any loss of generality, the intermediate region 32 may have a shape presenting circular symmetry about the axis H.

The optoelectronic device 1 further comprises a second bottom dielectric region 33, which is made, for example, of silicon nitride ($Si_3N_4$) and extends, in direct contact, underneath the intermediate region 32 and the portions of the first bottom dielectric region 30 left exposed by the intermediate region 32.

In greater detail, the second bottom dielectric region 33 is, to a first approximation, in the form of a layer, which has a thickness, for example, of between 1 µm and 3 µm (for instance, measured on the outside of the intermediate region 32). Moreover, the second bottom dielectric region 33 fills, together with the intermediate region 32, the aforementioned recess 31 formed by the first bottom dielectric region 30.

The optoelectronic device 1 further comprises a third bottom dielectric region 34, which is made, for example, of TEOS oxide and extends, in direct contact, underneath the second bottom dielectric region 33. For instance, the third dielectric region 34 has a thickness of between 1 µm and 10 µm. Moreover, the third bottom dielectric region 34 is delimited underneath by a fourth bottom surface $S_{b4}$.

The optoelectronic device 1 further comprises a receiver anode metallization 41, which is made of metal material (for example, a multilayer structure including a titanium layer and an aluminum layer, not illustrated singly) and extends underneath the fourth bottom surface $S_{b4}$, as well as through the third bottom dielectric region 34 and part of the second bottom dielectric region 33, until it contacts the intermediate region 32. Once again without this implying any loss of generality, also the receiver anode metallization 41 may have a circular symmetry about the axis H.

For practical purposes, the receiver anode region 12 and the enriched region 14 form a first PN junction of the receiver 4, which is to receive photons and to generate corresponding carrier pairs, following upon absorption of each photon. The enriched region 14 has, instead, the purpose of confining a high electrical field in the proximity of the first PN junction, reducing the breakdown voltage $V_B$ of the first PN junction. The guard ring 16 forms a second PN junction with the bottom epitaxial layer 7 so as to prevent edge breakdown of the receiver anode region 12.

As described in greater detail hereinafter, the receiver 4 forms a Geiger-mode avalanche photodiode (GMAP), i.e., a single-photon avalanche photodiode (SPAD), in so far as it is in theory able to detect arrival of single photons. In this connection, the first PN junction of the receiver 4 may be biased with a reverse-biasing voltage $V_A$ higher in modulus than the breakdown voltage $V_B$ (for example, $V_B$ may, in modulus, be approximately 12 V, whilst the modulus of $V_A$ may be comprised between 13 V and 15 V). In this way, the first PN junction has a particularly extensive depleted region, present inside which is a non-negligible electrical field. Consequently, generation of a single electron-hole pair, caused by absorption within the depleted region of a photon incident on the receiver 4, may be sufficient for triggering an ionization process. This ionization process in turn causes an avalanche carrier multiplication, with gains in the region of $10^6$, and consequent generation in short times (hundreds of picoseconds) of the so-called avalanche current, or more precisely of a pulse of the avalanche current (more briefly, avalanche pulse).

Once again with reference to the semiconductor body 5, it further comprises a layer 8, referred to hereinafter as "buffer layer 8", and a top epitaxial layer 9.

In detail, the buffer layer 8 extends over the first top surface $S_{a1}$ and is made of silicon carbide (SiC), for example of the 3C polytype. The buffer layer 8 is of an N type, has a thickness, for example, of between 0.5 µm and 1.5 µm and has a doping level, for example, of between $5 \cdot 10^{18}$ cm$^{-3}$ and $1 \cdot 10^{19}$ cm$^{-3}$.

The top epitaxial layer 9 extends over the buffer layer 8 and is made of the same semiconductor material as the buffer layer (in this case, silicon carbide of the 3C polytype, 3C-SiC). The top epitaxial layer 9 is of an N type, has a thickness, for example, of between 3 µm and 5 and has a doping level, for example, of between $5 \cdot 10^{15}$ cm$^{-3}$ and $5 \cdot 10^{16}$ cm$^{-3}$. The top epitaxial layer 9 is delimited at the top by a second top surface $S_{a2}$.

In practice, the buffer layer 8 and the top epitaxial layer 9 form, together with the substrate 6, a semiconductor heterostructure.

Extending through the top epitaxial layer 9 and the buffer layer 8 is a second cavity 37, which communicates with the underlying first cavity 10 and has, for example, a symmetrical shape, with an axis coinciding with the axis H. The second cavity 37 leaves a portion, laterally surrounding the first cavity 10 and designated by $S_x$, of the first top surface $S_{a1}$ exposed.

The optoelectronic device 1 further comprises a top dielectric region 44, which is made, for example, of TEOS oxide and extends on the second top surface $S_{a2}$, in contact with the top epitaxial layer 9. Moreover, the top dielectric region 44 coats the side wall of the second cavity 37, as well as the aforementioned portion $S_x$ of the first top surface $S_{a1}$. For instance, the top dielectric region 44 has a thickness of 0.4 µm.

The optoelectronic device 1 further comprises a cathode-contact region 24, which, in top plan view, has, for example, a hollow shape (for instance, the shape of an annulus or of a quadrangular frame).

In particular, the cathode-contact region 24 is arranged in a trench 36, which extends through the top dielectric region 44, the top epitaxial layer 9, the buffer layer 8, and a top portion of the substrate 6, so that a top portion of the trench 36 laterally surrounds, at a distance, the second cavity 37. This top portion of the trench 36 hence extends at a distance also from the portions of the top dielectric region 44 that coat the side wall of the second cavity 37. In addition, a bottom portion of the trench 36 laterally surrounds, at a distance, a top portion of the first cavity 10. In greater detail, and without this implying any loss of generality, the trench 36 may have a shape that is symmetrical about the axis H.

The cathode-contact region 24 comprises an outer region 27, arranged more externally, and an inner region 28, arranged more internally.

The outer region 27 is made of conductive material (for example, is formed by a corresponding multilayer structure consisting of a titanium layer and a titanium-nitride layer, not illustrated singly) and is arranged in direct contact with the semiconductor body 5 and with the top dielectric region 44. Furthermore, the outer region 27 coats the side walls and the bottom of the trench 36.

The inner region 28 is made of polysilicon (for example, of a P+ type and with a doping level of between $1 \cdot 10^{20}$ cm$^{-3}$ and $3 \cdot 10^{20}$ cm$^{-3}$), and comprises a main part, which is surrounded laterally and underneath by the outer region 27, with which it is in direct contact. A secondary part of the inner region 28 overlies the trench 36 and overlies, in direct contact, a top portion of the outer region 27 and adjacent portions of the top dielectric region 44.

Purely by way of example, the trench 36 has a depth that is invariant with respect to an angular co-ordinate of a cylindrical reference system with an axis that coincides with the axis H. This depth may, for example, be 10 µm. Moreover, the inner region 28 has a width, for example, of 1 µm, whereas the outer region 27 has a thickness, for example, of 100 nm.

The optoelectronic device 1 further comprises a further anode region 42, referred to hereinafter as "emitter anode region 42".

In detail, the emitter anode region 42 is made of 3C-poly-type silicon carbide, of a P+ type, with a doping level, for example, of between $5 \cdot 10^{17}$ cm$^{-3}$ and $1 \cdot 10^{18}$ cm$^{-3}$. In greater detail, the emitter anode region 42 extends in the top epitaxial layer 9, starting from the second top surface $S_{a2}$, and with a thickness, for example, of between 200 nm and 400 nm. Moreover, the emitter anode region 42 extends around the trench 36 so as to surround the latter laterally, at a distance.

Figure 2:
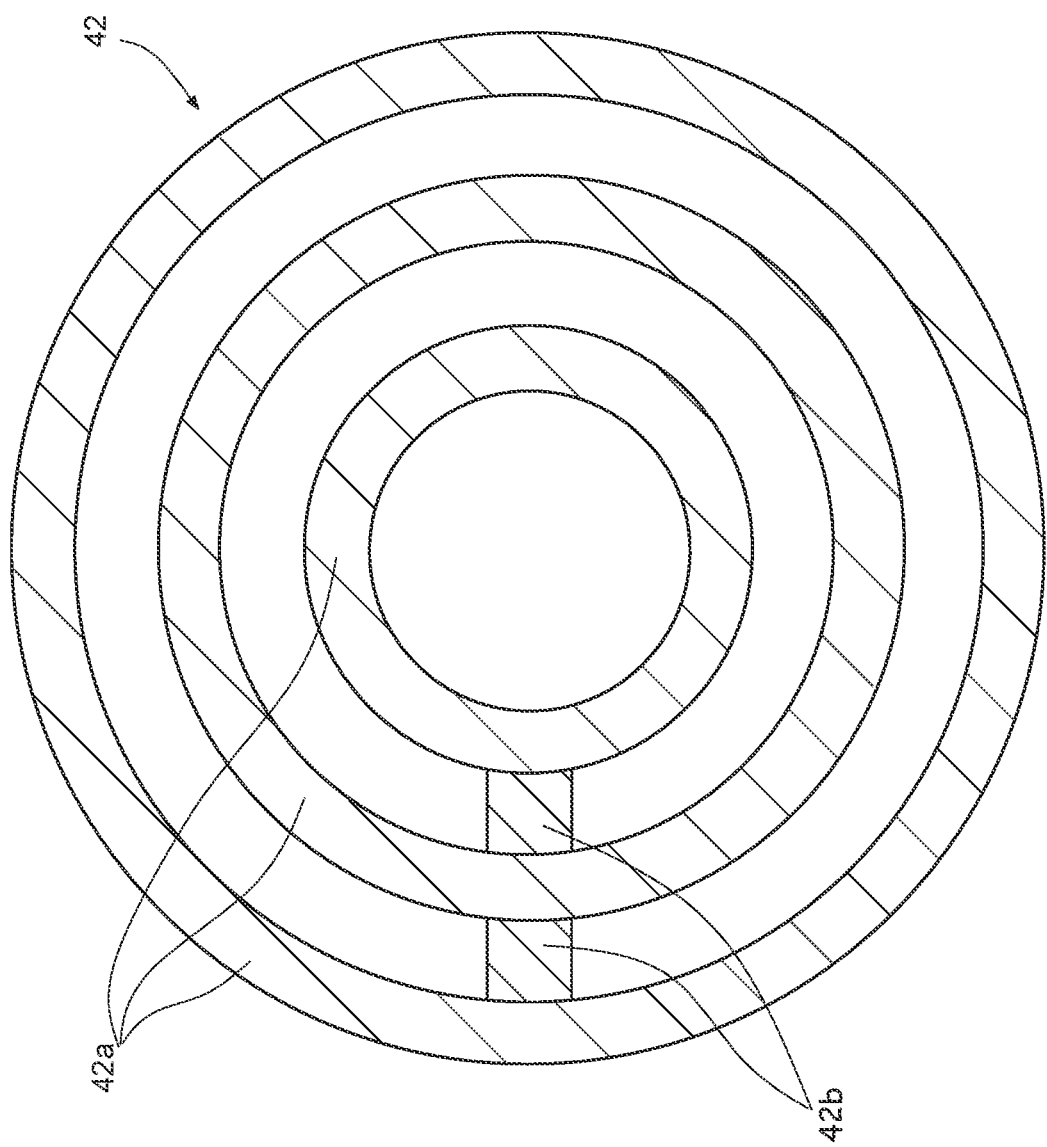
FIG. 2 is a schematic cross-sectional view from above of a region of the optoelectronic device illustrated in FIG. 1.

In greater detail, the emitter anode region 42 may have, for example, the shape illustrated in FIG. 2. In this case, the emitter anode region 42 has an elongated shape, which includes a plurality of concentric subportions of a circular shape (in top plan view), designated by 42a and connected to one another by a plurality of portions with linear extension (in top plan view), designated by 42b, each linear portion 42b contacting a pair of corresponding adjacent circular portions 42a.

As visible once again in FIG. 1, the aforementioned secondary part of the inner region 28 does not extend over the emitter anode region 42; i.e., it is laterally spaced apart with respect to the latter.

The optoelectronic device 1 further comprises an emitter anode metallization 50, which extends through the top dielectric region 44 so as to contact the emitter anode region 42, and a cathode metallization 52, which extends on the cathode-contact region 24, in direct contact with the latter.

In practice, the emitter anode region 42 and the top epitaxial layer 9 form a third PN junction, made of silicon carbide, hence of a semiconductor material different from the semiconductor material that forms the first PN junction of the receiver 4. This third PN junction forms the emitter 2, which operates as an emitter diode.

Once again with reference to the third PN junction, since the buffer layer 8 has a doping level higher than that of the top epitaxial layer 9, the corresponding depleted region does not extend in the buffer layer 8. The buffer layer 8 is hence substantially neutral from an electrical standpoint. In addition, the buffer layer 8 prevents direct growth of the top epitaxial layer 9 starting from the substrate 6, which could cause generation of an excessively defective interface.

In practice, the optoelectronic device 1 integrates in one and the same die a silicon diode and a silicon-carbide emitter.

In greater detail, the emitter 2 and the receiver 4 share the cathode terminal, which is formed by the cathode-contact region 24, which, as has been said, contacts, inter alia, both the top epitaxial layer 9 and the substrate 6, which forms, together with the bottom epitaxial layer 7 and the enriched region 14, the cathode of the receiver 4.

In use, the third PN junction of the emitter 2 can be forward biased (for example, at a voltage of between 2 V and 4 V), in which case it emits photons (designated by $F_{out}$), with a wavelength comprised in the ultraviolet, visible, and in near infrared (NIR), i.e., between 200 nm and 1100 nm.

The cathode-contact region 24 absorbs any possible photons $F_{out}$ coming from the emitter 2 and directed towards the receiver 4 (in particular, photons in the visible or in the ultraviolet) so as to prevent the latter from being illuminated by radiation that comes directly from the emitter 2, i.e., by radiation that has not interacted with a possible sample to be analyzed. Moreover, the receiver 4 operates in a so-called back-illuminated mode; hence, it detects photons (designated by $F_{in}$) that impinge upon it after traversing, in succession, the second cavity 37 and the first cavity 10.

Thanks to the fact that the photons $F_{in}$ impinge upon the receiver 4, without first having to traverse, inter alia, the substrate 6, it means that the efficiency of detection of the receiver 4 is optimized, in particular in the near infrared. This fact, combined with the high sensitivity that can be obtained in Geiger mode, means that the receiver 4 can detect very weak lights flows, even in the near infrared. Moreover, detection is very fast since the absorption of photons does not take place in the substrate 6, a phenomenon that would lead to delays depending upon the time required by the carriers thus generated to diffuse as far as the first PN junction.

Figure 3:
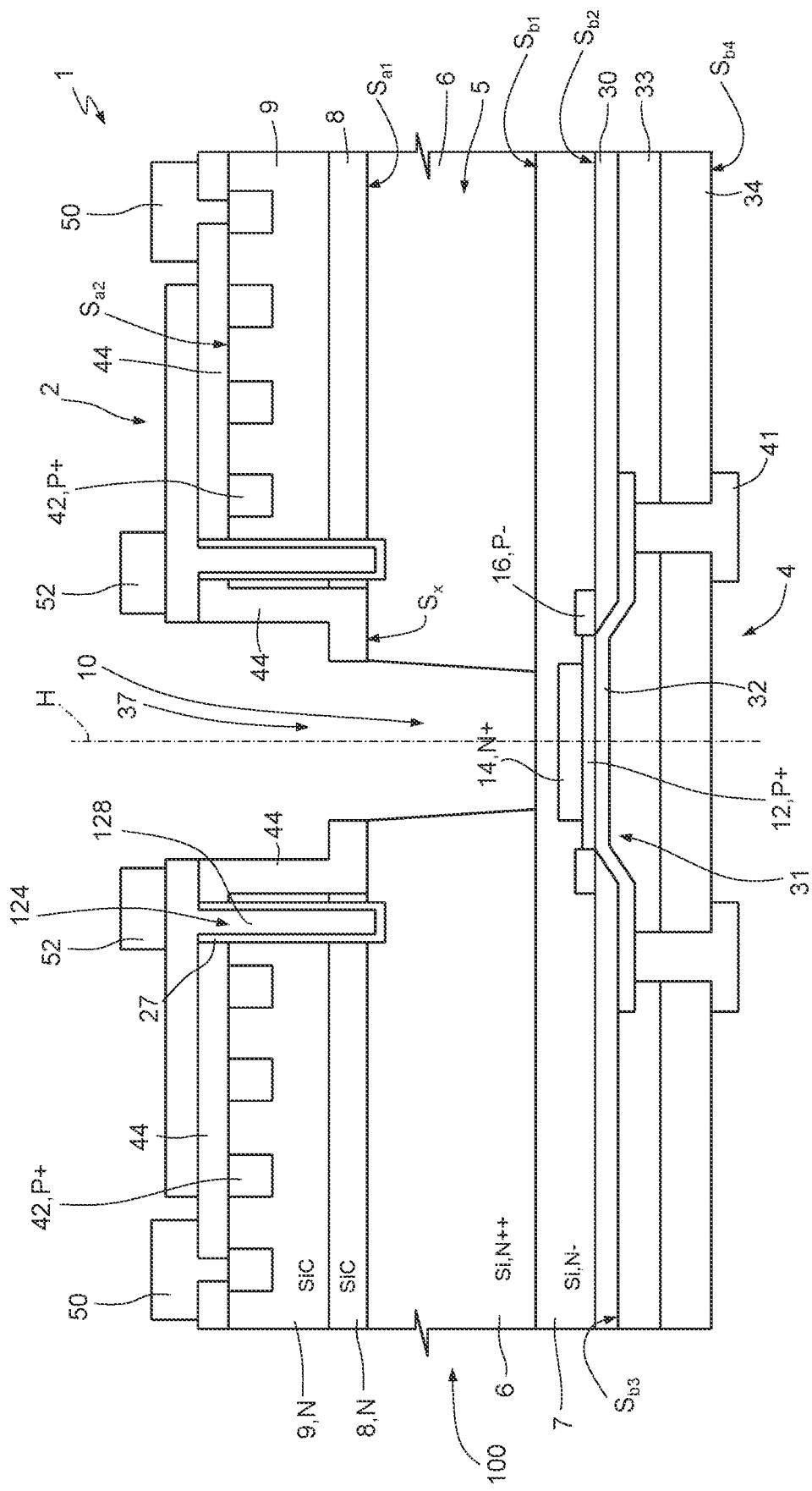

FIG. 3 shows a different embodiment, which is now described limitedly to the differences with respect to the embodiment illustrated in FIG. 1. Moreover, elements already present in the embodiment illustrated in FIG. 1 are designated by the same references, except where otherwise specified.

In detail, the secondary part of the inner region of the cathode-contact region (said regions being here designated, respectively, by 128 and 124) overlies, at a distance, at least part of the emitter anode region 42. Without this implying any loss of generality, a first part of the emitter anode region 42 is overlaid by the emitter anode metallization 50, whereas a second part of the emitter anode region 42 is overlaid, at a distance, by the secondary part of the inner region 128 of the cathode-contact region 124, so that each portion of the emitter anode region 42 is overlaid alternatively by the emitter anode metallization 50 or else by the inner region 128. In this way, the photons in the visible and near ultraviolet emitted outwards by the emitter 2 are absorbed (principally, by the inner region 128), thus improving the characteristics of spectral purity in the infrared of the radiation emitted.

Figure 4:
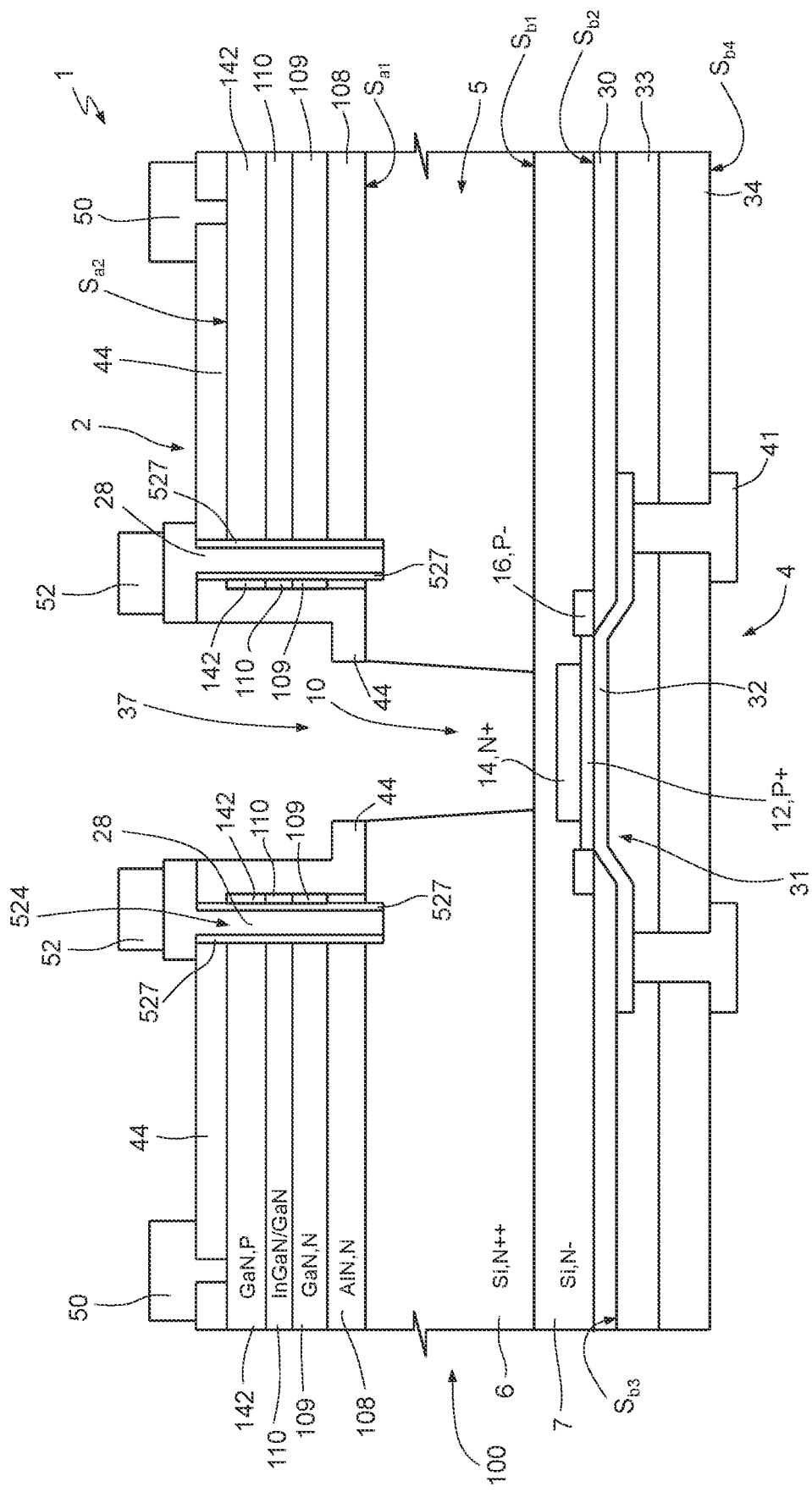

FIG. 4 shows a different embodiment, which is now described limitedly to the differences with respect to the embodiment illustrated in FIG. 1. In addition, elements already present in the embodiment illustrated in FIG. 1 are designated by the same references, except where otherwise specified.

In detail, the buffer layer, here designated by 108 is made of aluminum nitride (AlN), is of an N type, has a thickness, for example, of between 0.5 μm and 1.5 μm, and has a doping level, for example, of between $5·10^{18}$ cm$^{-3}$ and $1·10^{19}$ cm$^{-3}$.

The top epitaxial layer, herein designated by 109, is made of gallium nitride (GaN). In particular, the top epitaxial layer 109 has a doping of an N type (for example, obtained using silicon or germanium atoms), has a thickness, for example, of between 0.4 μm and 0.6 μm, and has a doping level, for example, of between $5·10^{15}$ cm$^{-3}$ and $5·10^{16}$ cm$^{-3}$.

In practice, the buffer layer 108 performs the function of matching the crystal lattice of the top epitaxial layer 109, made of aluminum nitride, to the underlying crystal lattice of the substrate 6, made of silicon. For this reason, the buffer layer 108 is made of a semiconductor material having a lattice constant intermediate between the lattice constants of the materials that form the substrate 6 and the top epitaxial layer 109.

The emitter anode region, here designated by 142, is layered and forms the second top surface $S_{a2}$. In particular, the emitter anode region 142 is formed by a layer of gallium nitride (GaN), which has a doping of a P type (obtained with magnesium or iron), has a thickness, for example, of between 0.1 μm and 0.4 μm, and has a doping level, for example, of between $1·10^{18}$ cm$^{-3}$ and $1·10^{19}$ cm$^{-3}$.

Extending between the top epitaxial layer 109 and the emitter anode region 142 is a multi-quantum-well (MQW) structure 110, of a type in itself known.

For instance, albeit not illustrated in detail, the MQW structure 110 may be formed by a number of layers (for example, five layers) of a first type, interspersed by an equal number of layers of a second type. For instance, each layer of the first type may be a layer of gallium nitride (GaN) and may have a thickness, for example, of 15 nm; each layer of the second type may be a layer of indium gallium nitride (InGaN) and may have a thickness, for example, of 3 nm. Both the layers of the first type and the layers of the second type may be substantially intrinsic (or else of an N type), as regards doping, so that the top epitaxial layer 109, the emitter anode region 142, and the multi-quantum-well structure 110 form a sort of PIN structure.

Once again with reference to FIG. 4, the cathode-contact region, here designated by 524, traverses both the emitter anode region 142 and the multi-quantum-well structure 110, as well as the buffer layer 108 and the top epitaxial layer 109. Moreover, the side walls of the trench 36 are coated by an insulation region 527, instead of by the outer region 27. In particular, the insulation region 527 is made, for example, of TEOS oxide, has a thickness, for example, of 100 nm, and leaves the bottom of the trench 36 exposed so that the inner region 28 contacts the substrate 6, but is insulated from the buffer layer 108, from the top epitaxial layer 110, and from the emitter anode region 142.

In general, the presence of the MQW structure 110 is optional; hence embodiments (not illustrated) are possible in which the emitter anode region 142 is arranged on the top epitaxial layer 109, in direct contact therewith. However, the embodiment illustrated in FIG. 4 is characterized by a better efficiency of emission.

Moreover possible are embodiments (not illustrated) of the type illustrated in FIG. 4, with or without MQW structure 110, and in which the aforementioned secondary part of the inner region is at least in part superimposed, at a distance, on the emitter anode region 142 so as to improve the characteristics of spectral purity in the infrared of the radiation emitted.

Irrespective of the possible extension of the secondary part of the inner region on the emitter anode region, moreover possible are embodiments of the type illustrated in FIG. 5, which is now described with reference to just the aspects that vary with respect to the embodiment of FIG. 4.

In detail, the cathode-contact region 24 is of the type illustrated in FIGS. 1 and 3, whereas the MQW structure 110 is absent. In addition, the top epitaxial layer 9 forms the second top surface $S_{a2}$. The emitter anode region, here designated by 242, has for example the same shape as the one illustrated in FIG. 1 and extends in the top epitaxial layer 109, starting from the second top surface $S_{a2}$. In addition, the emitter anode region 242 is made of gallium nitride of a P+ type (for example, doped with magnesium or iron) and has a doping level, for example, of between $1·10^{18}$ cm$^{-3}$ and $1·10^{19}$ cm$^{-3}$.

Moreover possible are embodiments in which the emitter is optimized so as to present characteristics of emission in the infrared of a substantially SPLE type. In other words, for each of the embodiments described previously, a corresponding variant is possible.

Figure 6:
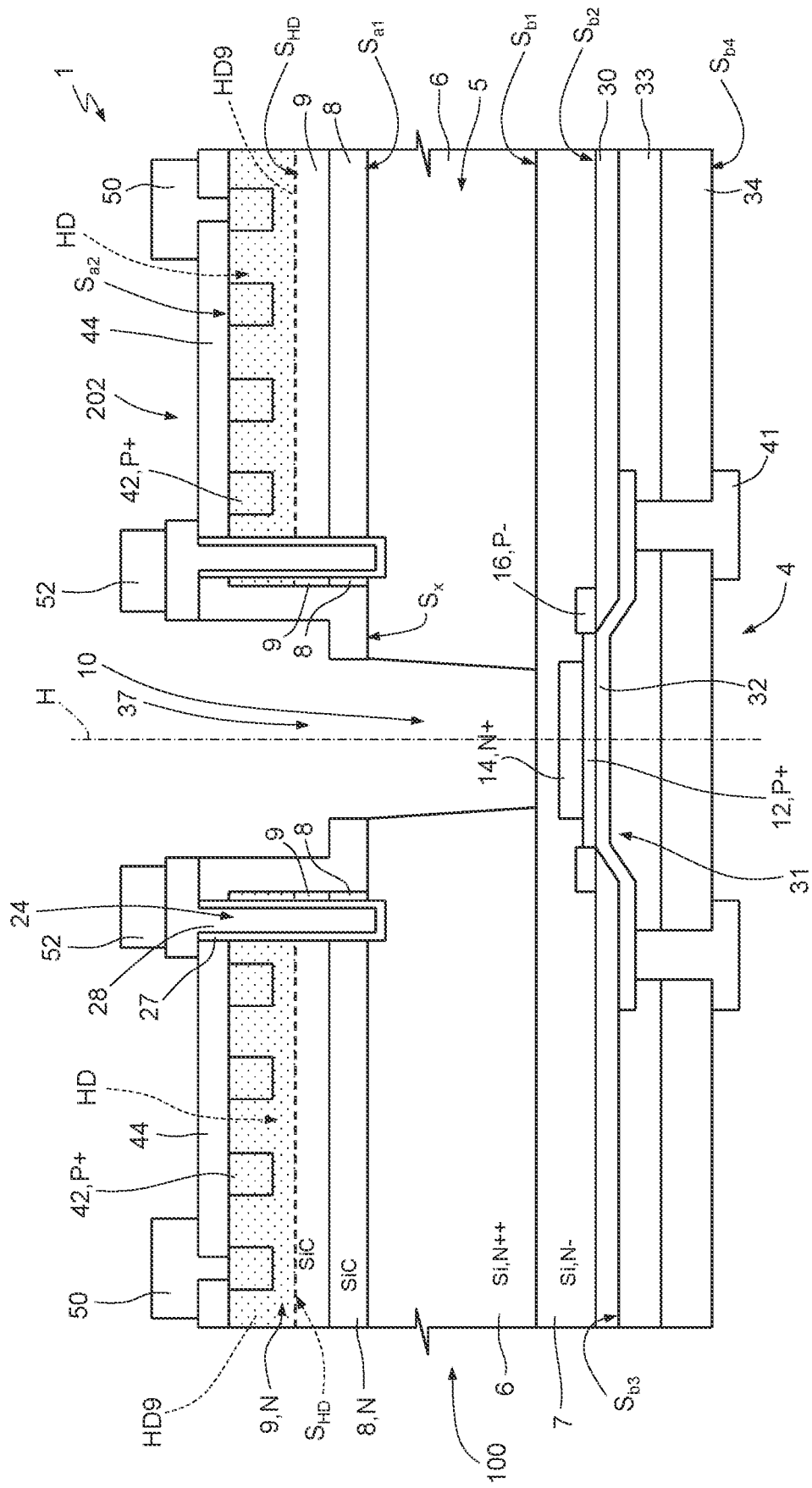

By way of example, FIG. 6 shows an embodiment identical to the one illustrated in FIG. 1, but in which in the active area of the emitter (designated by 202), and hence in the proximity of the aforementioned third PN junction, defects in the lattice structure are created in order to obtain energy levels that can allow single-photon emission, mainly in the infrared.

In greater detail, the optoelectronic device 1 comprises an area of high defectiveness HD, which extends from the second top surface $S_{a2}$ as far as, to a first approximation, an intermediate surface $S_{HD}$, interposed between the emitter anode region 42 and the buffer layer 8, at a distance therefrom. In practice, the area with high defectiveness HD extends in the emitter anode region 42 and in a top portion of the top epitaxial layer 9 (designated by HD9), the latter being arranged on the intermediate surface $S_{HD}$. In addition, the area with high defectiveness HD has a lattice defectiveness higher than the defectiveness present in a bottom portion of the top epitaxial layer 9, arranged underneath the intermediate surface $S_{HD}$.

In greater detail, the area with high defectiveness HD has, within the crystal lattice of the silicon carbide, atoms belonging to group IV or group VIII of the periodic table, so as not to modify the electrical conductivity. Moreover, present in the area with high defectiveness HD are vacancies of silicon atoms in the crystal lattice of the silicon carbide.

In particular, these vacancies present in the area with high defectiveness HD may have a concentration of at least $10^{13}$ atoms/cm$^{-3}$, so as to be precisely in a concentration higher than the mean values of the vacancies of silicon atoms in the silicon carbide in the bottom portion of the top epitaxial layer 9 and in the buffer layer 8. These vacancies are precisely due to the presence in the semiconductor crystal lattice of non-bound atoms of group IV or group VIII.

In use, to a first approximation it may be assumed that the depleted region of the third PN junction coincides with the top portion HD9 of the bottom epitaxial layer 9. Consequently, this depleted region has a relatively high level of defectiveness, thus favoring emission of a SPLE type in the infrared.

In greater detail, the emitter 2 implements a mechanism of generation of light of the type described in "Silicon carbide light-emitting diode as a prospective room temperature source for single photons" by F. Fuchs et al., https://www-.nature.com/articles/srep01637, published online on Apr. 10, 2013, where it is shown that a silicon-carbide photodiode may present a non-negligible emission peak at approximately 900 nm, given that this peak can be put down to the presence of vacancies of silicon atoms in the crystalline silicon carbide that can be obtained by irradiation of high-energy electrons. In particular, the vacancies determine the presence, within the band gap, of discrete energy levels, between which there occur recombinations of the carriers, which lead to emission of light in the near infrared (NIR), this emission having characteristics of single-photon emission.

Figure 7:
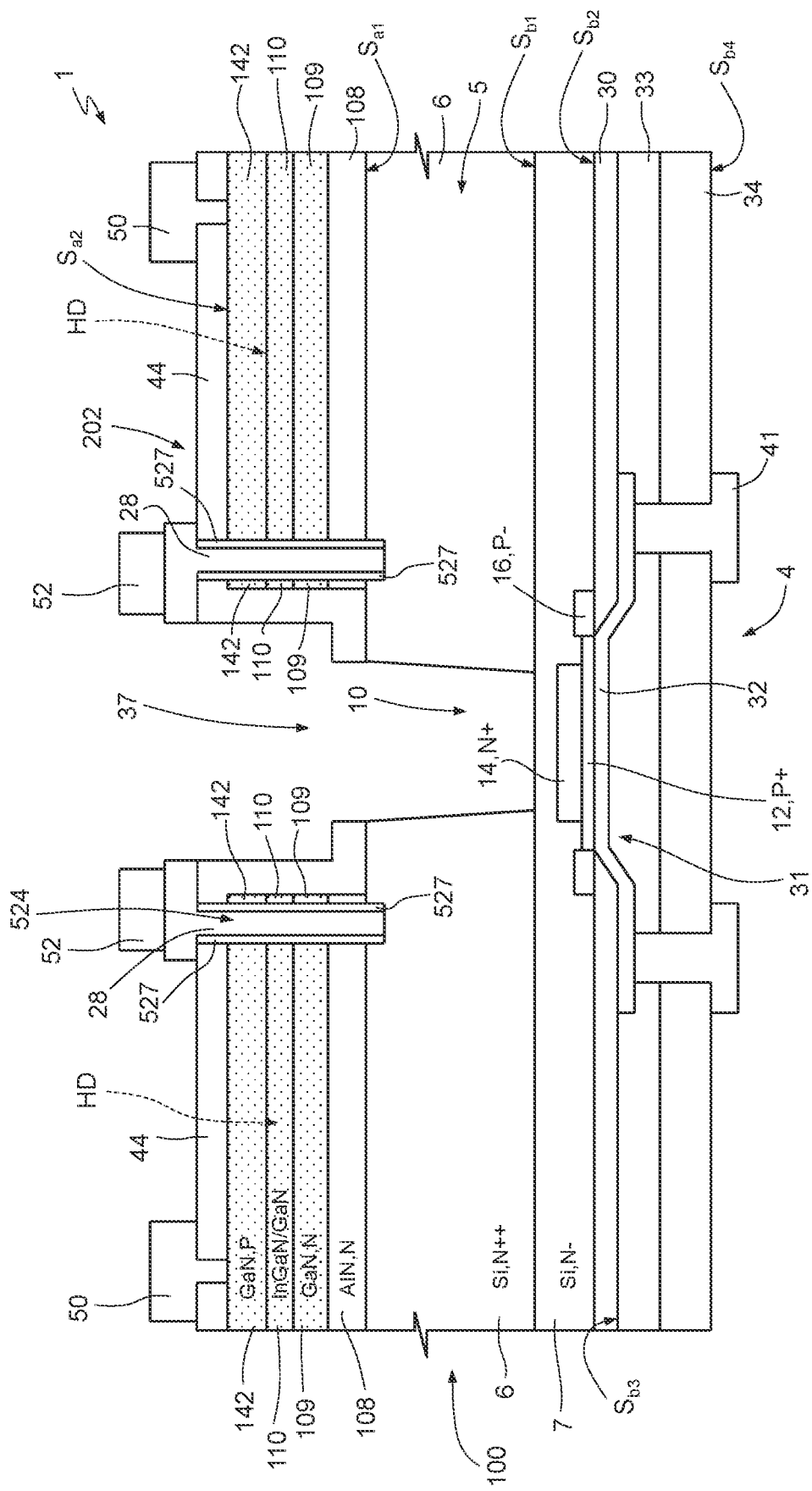

Likewise, FIG. 7 shows a variant of the embodiment illustrated in FIG. 4, where the region with high defectiveness HD extends in the emitter anode region 142, in the MQW structure 110, and in the top epitaxial layer 9, which, as explained previously, form a PIN diode, the depleted region of which extends, to a first approximation, only in the MQW structure 110 and in the top epitaxial layer 9. Hence, also in this case, the depleted region has a relatively high defectiveness, thus favoring emission of a SPLE type in the infrared.

Figure 5:
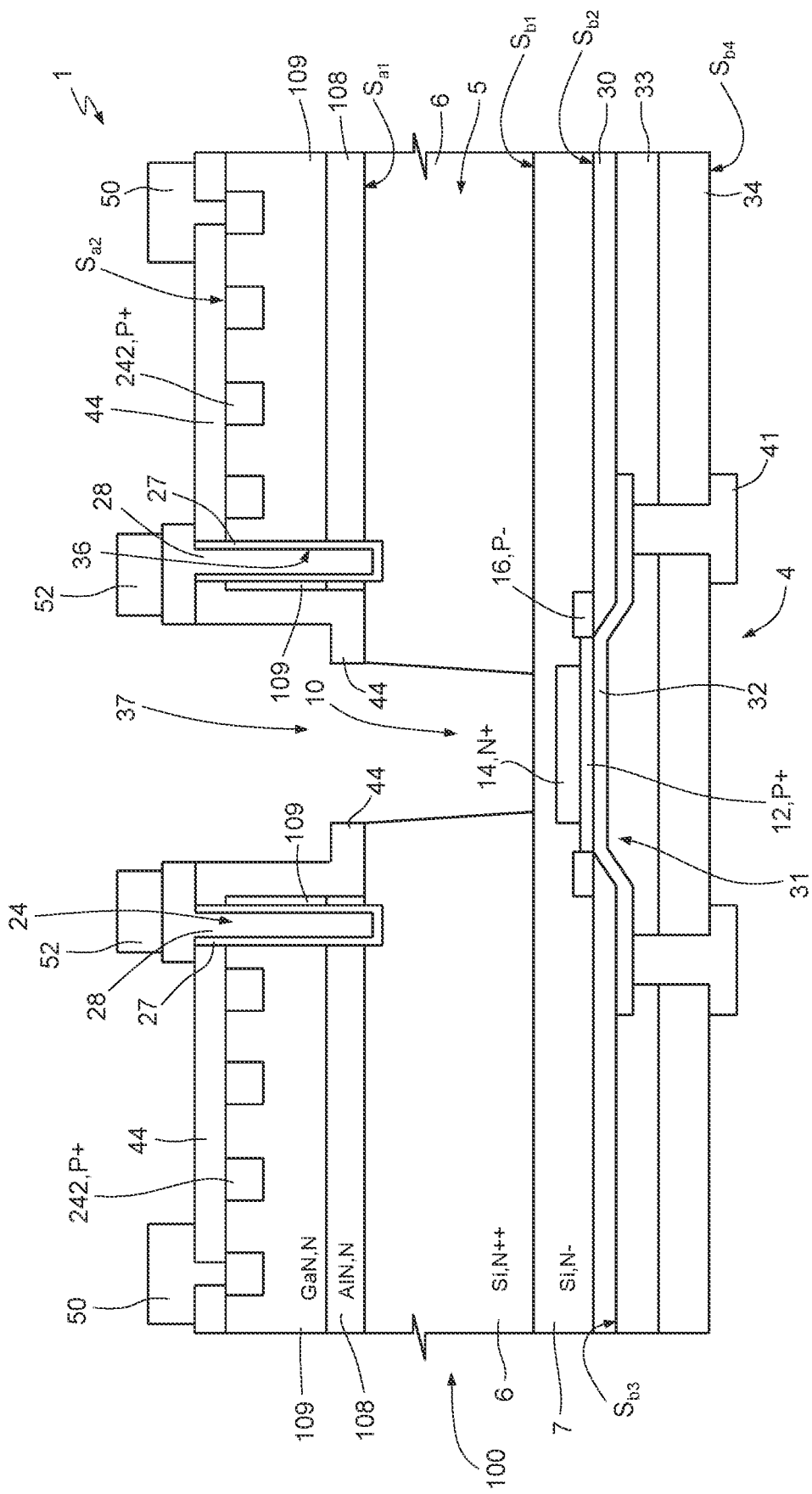

Likewise, FIG. 8 shows a variant of the embodiment illustrated in FIG. 5, in which the region with high defectiveness HD extends in the emitter anode region 242 and in the top epitaxial layer 109. To a first approximation, it may be assumed that the depleted region extends in the top epitaxial layer 109, hence once again in an area with relatively high defectiveness.

Both in the embodiment illustrated in FIG. 7 and in the embodiment illustrated in FIG. 8, the area with high defectiveness HD has, within the semiconductor crystal lattice, atoms belonging to group IV or group VIII of the periodic table. In addition, in the area with high defectiveness HD vacancies of atoms of semiconductor material are present (in particular, atoms of indium, gallium, and nitrogen, in the case of FIG. 7, and atoms of gallium and nitrogen, in the case of FIG. 8), these vacancies having once again a concentration of at least $10^{13}$ atoms/cm$^{-3}$ so as to be precisely in a concentration higher than the mean value in the buffer layer 8.

The embodiment illustrated in FIG. 6 can be obtained by employing the manufacturing process described hereinafter.

Initially, as illustrated in FIG. 9, the substrate 6 and the bottom epitaxial layer 7 are formed, as well as a first dielectric protective layer 70, arranged in contact with the second bottom surface $S_{b2}$, made of TEOS oxide and having a thickness, for example, of 5 µm.

Then, as illustrated in FIG. 10, thermally grown on the first top surface $S_{b1}$ in a way in itself known is a layer of tantalum carbide (TaC), which has a thickness, for example, of 5 µm, and is referred to hereinafter as "masking layer 72".

Next, as illustrated in FIG. 11, the masking layer 72 is selectively etched (for example, with a dry etch), so as to pattern it. Albeit not shown, the etch may be carried out using a resist mask, which is removed once etching is through. The remaining portions of the masking layer 72 form a tantalum-carbide mask 73.

Next, as illustrated in FIG. 12, thermally grown, in succession and in a way in itself known, are the buffer layer 8 and the top epitaxial layer 9. In particular, the buffer layer 8 is grown selectively, starting from the portions of the first top surface Sal left exposed by the mask 73. Likewise, the top epitaxial layer 9 is grown selectively starting from the buffer layer 8. The mask 73 is then removed after the top epitaxial layer 9 has been formed, starting from the buffer layer 8.

In greater detail, formation of the buffer layer 8 and of the top epitaxial layer 9 causes simultaneous formation of the second cavity 37, the bottom of which is temporarily occupied by the mask 73, prior to removal of the latter.

Figure 13:
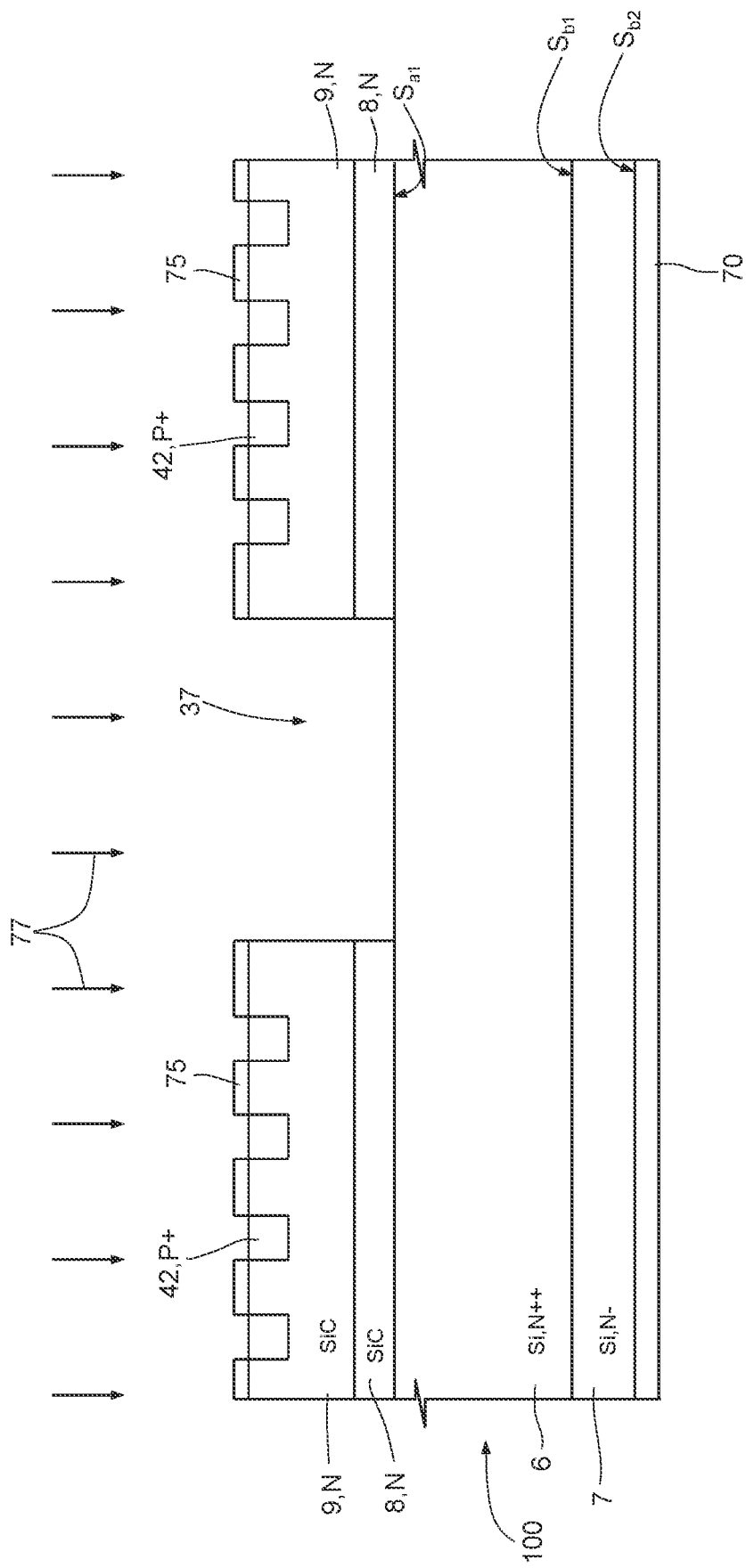

Then, as illustrated in FIG. 13, the emitter anode region 42 is formed in a way in itself known. In particular, formation of the emitter anode region 42 initially envisages formation of a hard mask 75 of TEOS oxide on the second top surface $S_{a2}$, this hard mask 75 having a thickness, for example, of 0.8 µm. Next, a double implantation of dopant species of a P type, for example aluminum (represented by the arrows 77), is carried out with a dosage level, for example, of $5 \cdot 10^{13}$ cm$^{-2}$ and an energy of 30 keV and with a dosage level of $1 \cdot 10^{14}$ cm$^{-2}$ and an energy of 80 keV.

Next, the hard mask 75 is removed and a thermal annealing process is carried out, having a duration, for example, of approximately 2 h at a temperature, for example, of approximately 1300° C., in order to activate the dopant species implanted in the emitter anode region 42. Albeit not shown, in a way in itself known execution of the thermal annealing treatment may be preceded by formation, on the top epitaxial layer 9 and within the second cavity 37, of a polymeric layer, which is graphitized (for example, by means of a respective thermal annealing treatment in argon atmosphere, at a temperature of approximately 800° C. and for a duration of approximately 30 min). Once again in a way not illustrated, this graphitized polymeric layer is then removed after execution of the aforementioned thermal treatment for activation of the dopant species, for instance by means of an initial thermal oxidation (for example, by carrying out a further thermal treatment at 900° C., for a duration of approximately 30 min in oxygen atmosphere) of the graphitized polymeric layer and subsequent wet etching.

Figure 14:
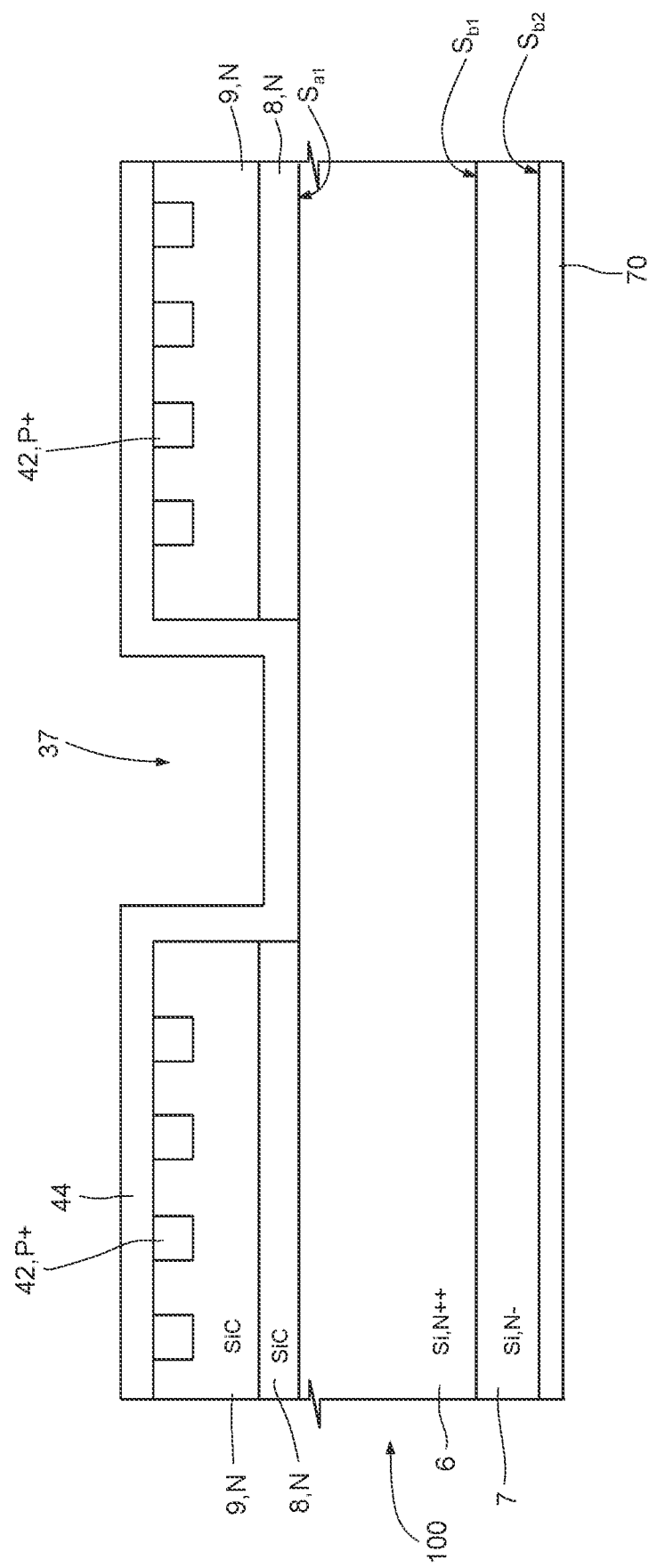

Then, as illustrated in FIG. 14, formed by deposition of TEOS oxide is the top dielectric region 44, which extends on the top epitaxial layer 9, the emitter anode region 42, and the side wall and the bottom of the second cavity 37.

Figure 15:
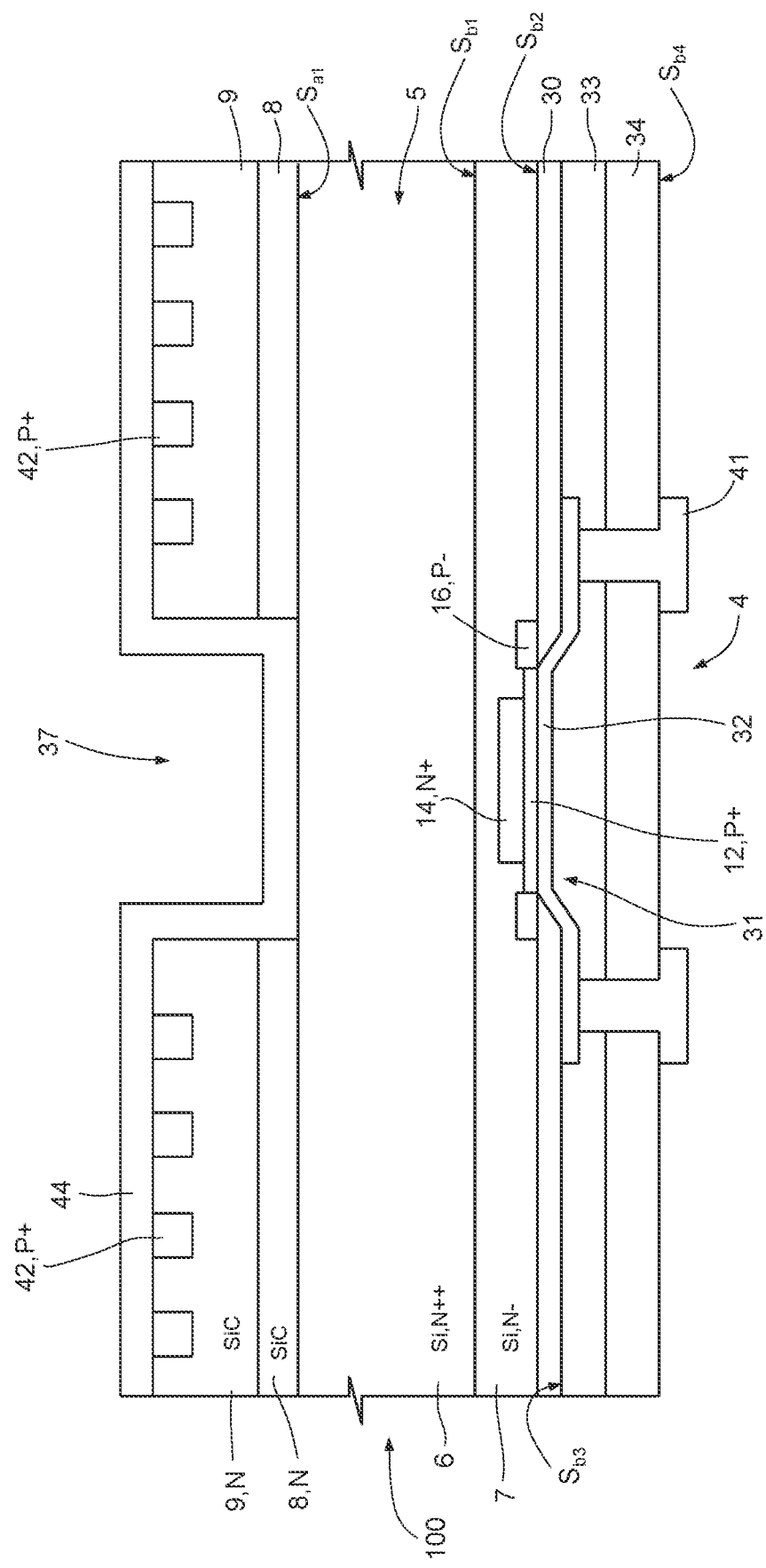

Next, in a way in itself known and consequently not illustrated or described in detail, the receiver 4 is formed, with a process carried out on the back of the die 100. In particular, as illustrated in FIG. 15, the first dielectric protective layer 70 is removed, and subsequently the anode region 12, the enriched region 14, the guard ring 16, the first, second, and third bottom dielectric regions 30, 33, 34, the intermediate region 32, and the receiver anode metallization 41 are formed.

Figure 16:
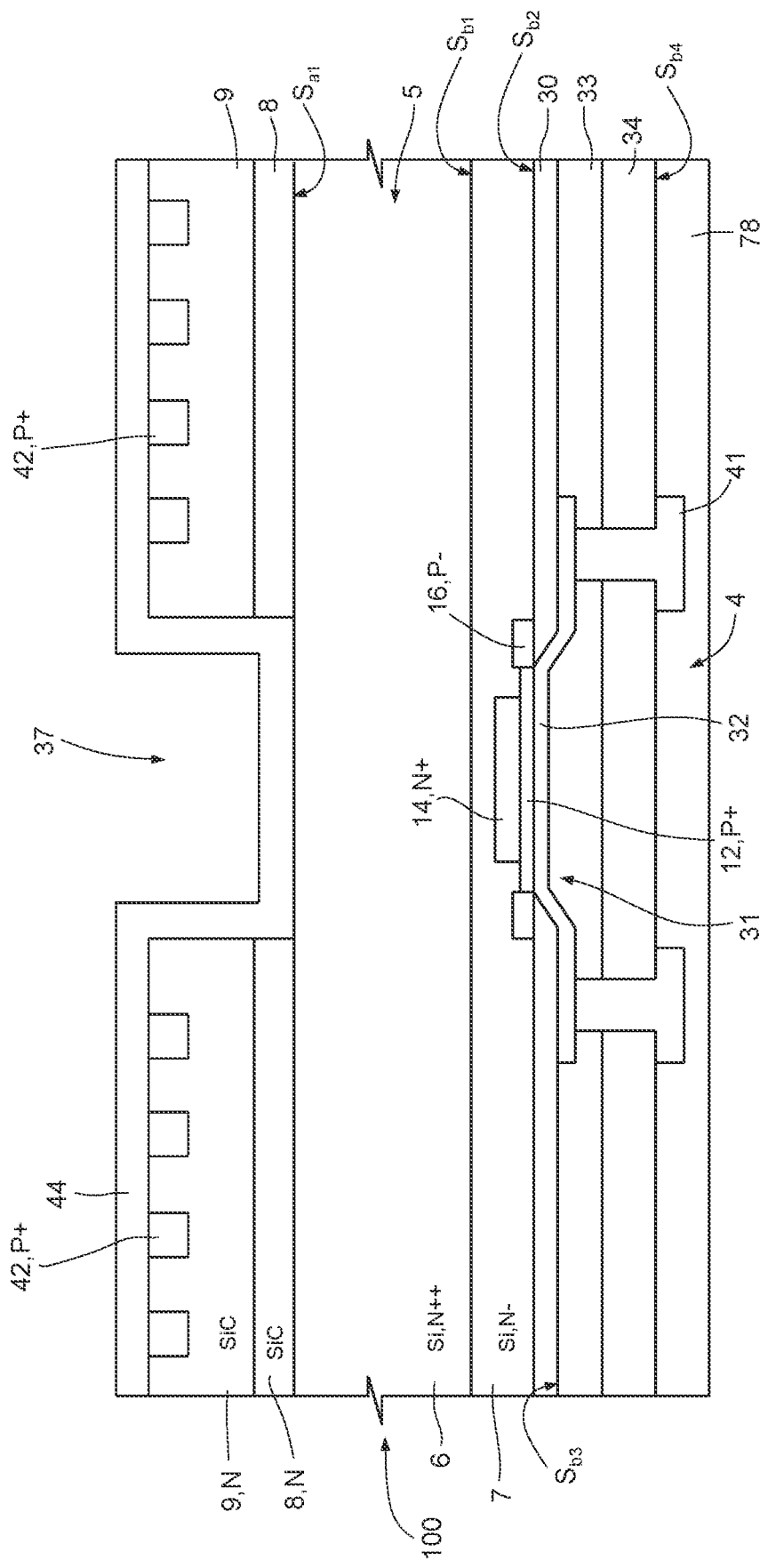

Then, as illustrated in FIG. 16, in contact with the fourth bottom surface $S_{b4}$ a second dielectric protective layer 78 is formed so as to coat the receiver anode metallization 41 and the exposed portions of the third bottom dielectric region 34. For instance, the second dielectric protective layer 78 is made of polymethyl methacrylate (PMMA) and has a thickness, for example, of 5 µm.

Figure 17:
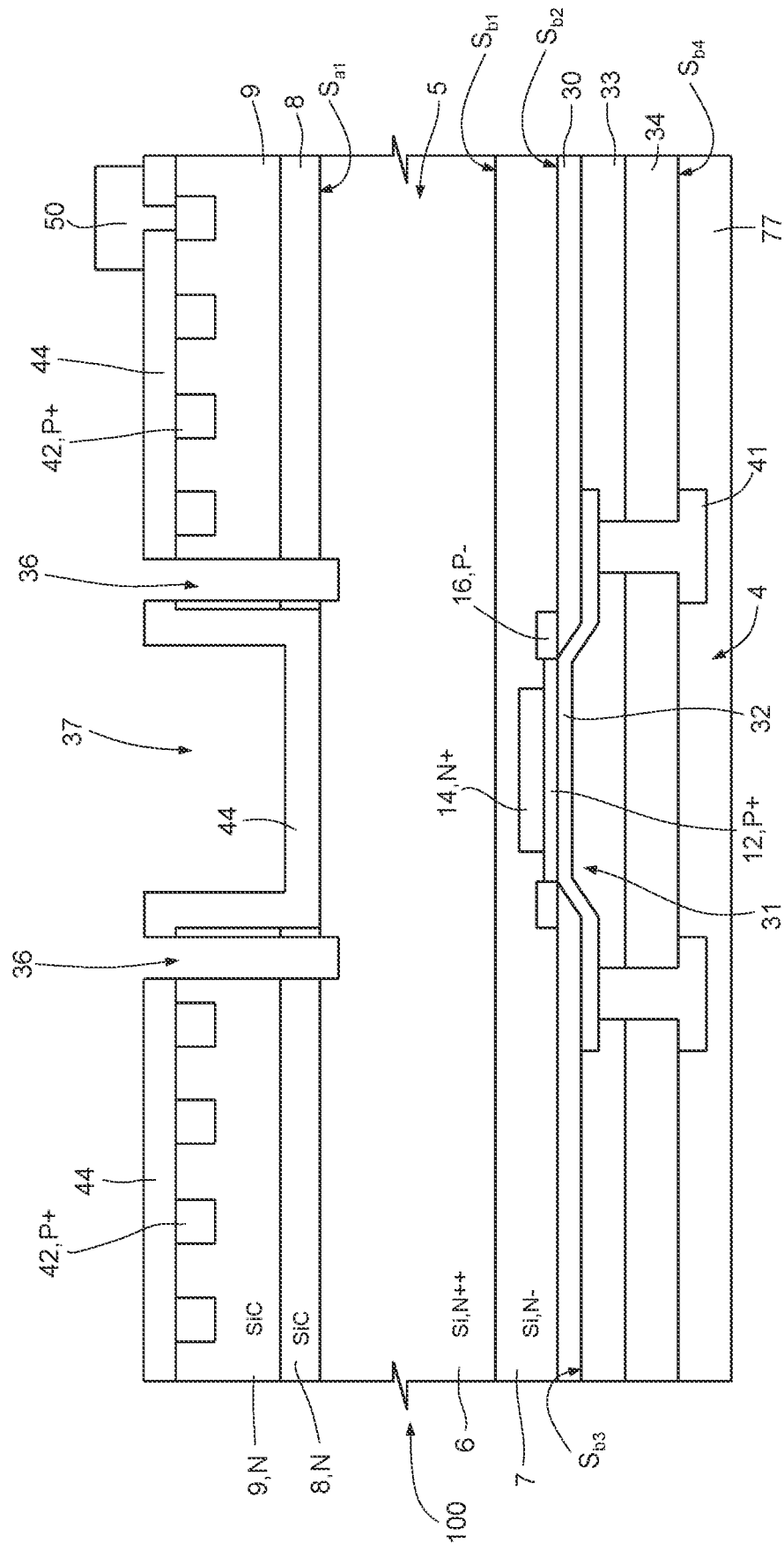

Next, as illustrated in FIG. 17, the trench 36 is formed by carrying out a first selective etch of portions of the top dielectric region 44 and a second selective etch of underlying portions of semiconductor material. These first and second etches may be of a dry type and may be carried out using one and the same mask (not illustrated), which is made, for example, of resist and is subsequently removed.

Figure 18:
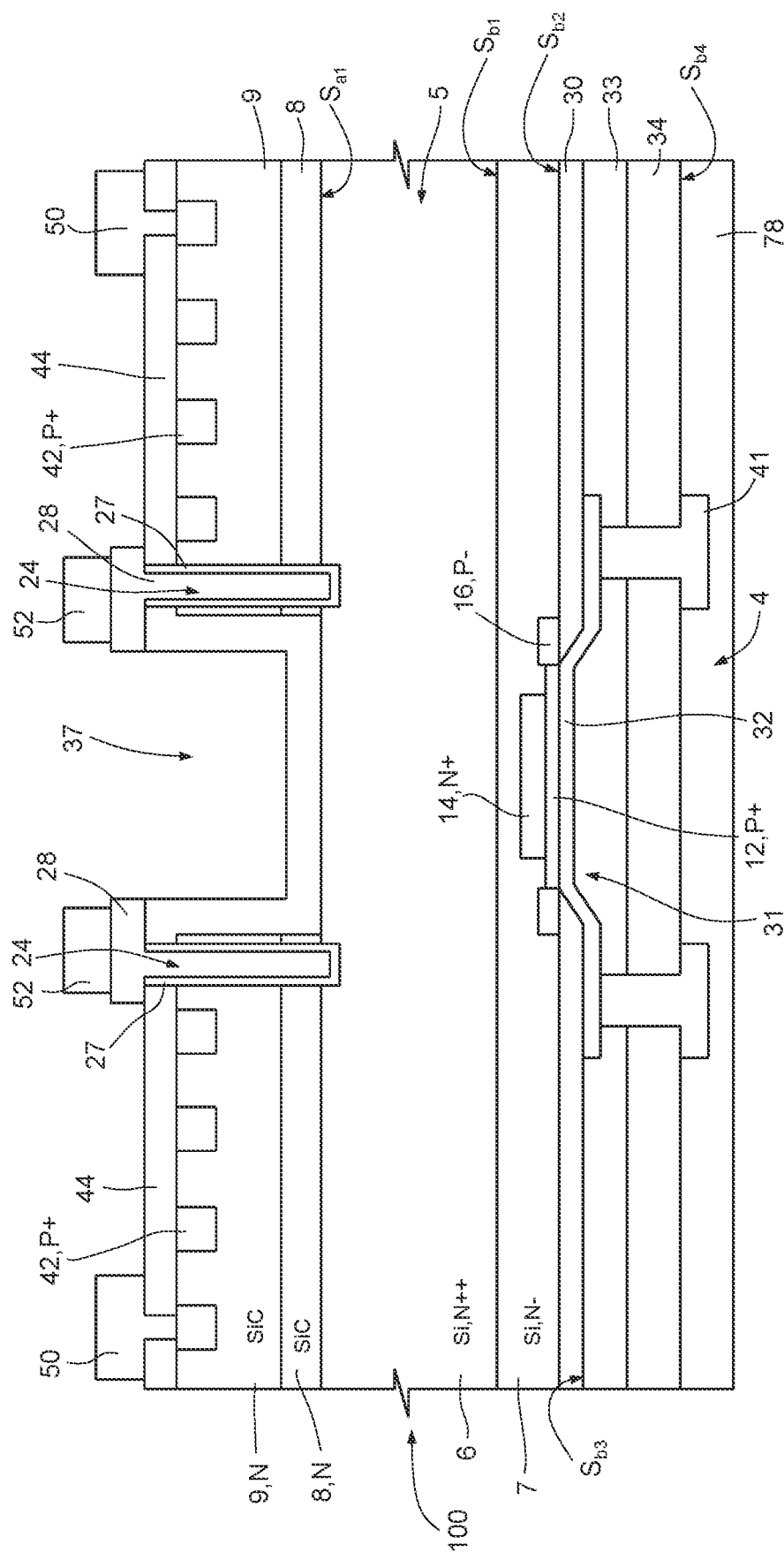

In a way not described in detail, the cathode-contact region 24, the emitter anode metallization 50, and the cathode metallization 52 are subsequently formed, as illustrated in FIG. 18.

Figure 19:
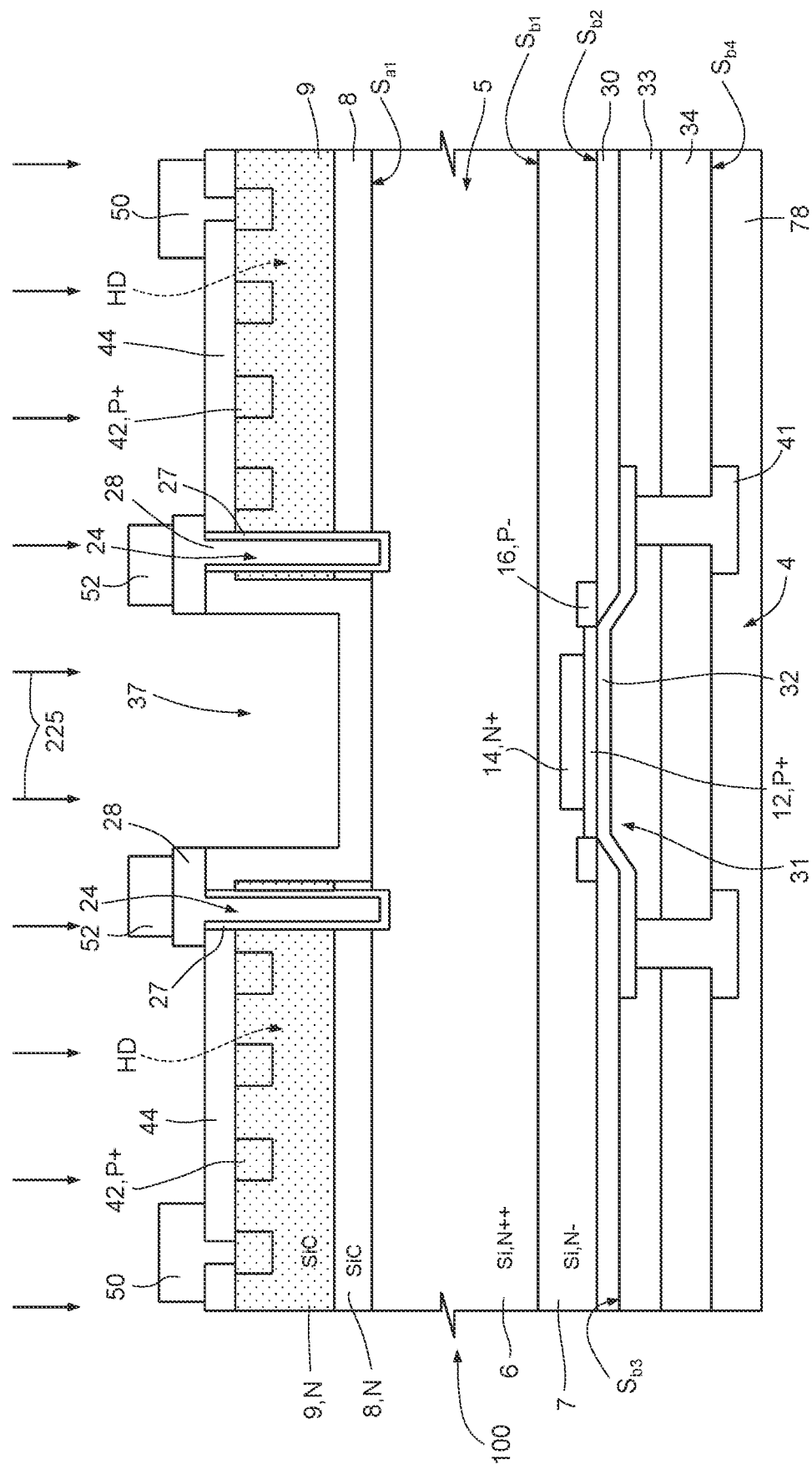

Then, as illustrated in FIG. 19, an ion implantation (represented schematically by the arrows 225) is carried out such as to create the area with high defectiveness HD. The implantation process 225 is carried out with ions of atoms belonging to group IV or group VIII of the periodic table so as not to modify the conductivity in the implantation area. For instance, ions of one or more of the following may be implanted: carbon (C), silicon (Si), helium (He), argon (Ar), and neon (Ne). Implantation with carbon may, for example, be carried out with a dosage level of between $10^{11}$ cm$^{-2}$ and $10^{13}$ cm$^{-2}$ and an energy of between 90 keV and 200 keV. Implantation with silicon may, for example, be carried out with a dosage level of between $10^{11}$ cm$^{-2}$ and $10^{13}$ cm$^{-2}$ and an energy of between 200 keV and 400 keV. Implantation with helium may, for example, be carried out with a dosage level of between $10^{12}$ cm$^{-2}$ and $10^{14}$ cm$^{-2}$ and an energy of between 30 keV and 80 keV. Implantation with argon may, for example, be carried out with a dosage level of between $10^{12}$ cm$^{-2}$ and $10^{14}$ cm$^{-2}$ and an energy of between 200 and 400 keV. Implantation with neon may, for example, be carried out with a dosage level of between $10^{11}$ cm$^{-2}$ and $10^{13}$ cm$^{-2}$ and an energy of between 150 and 250 keV. Possibly, the implantation energies may be modified, modulating the thickness of the top dielectric region 44, which functions as pre-implant shield.

Figure 20:
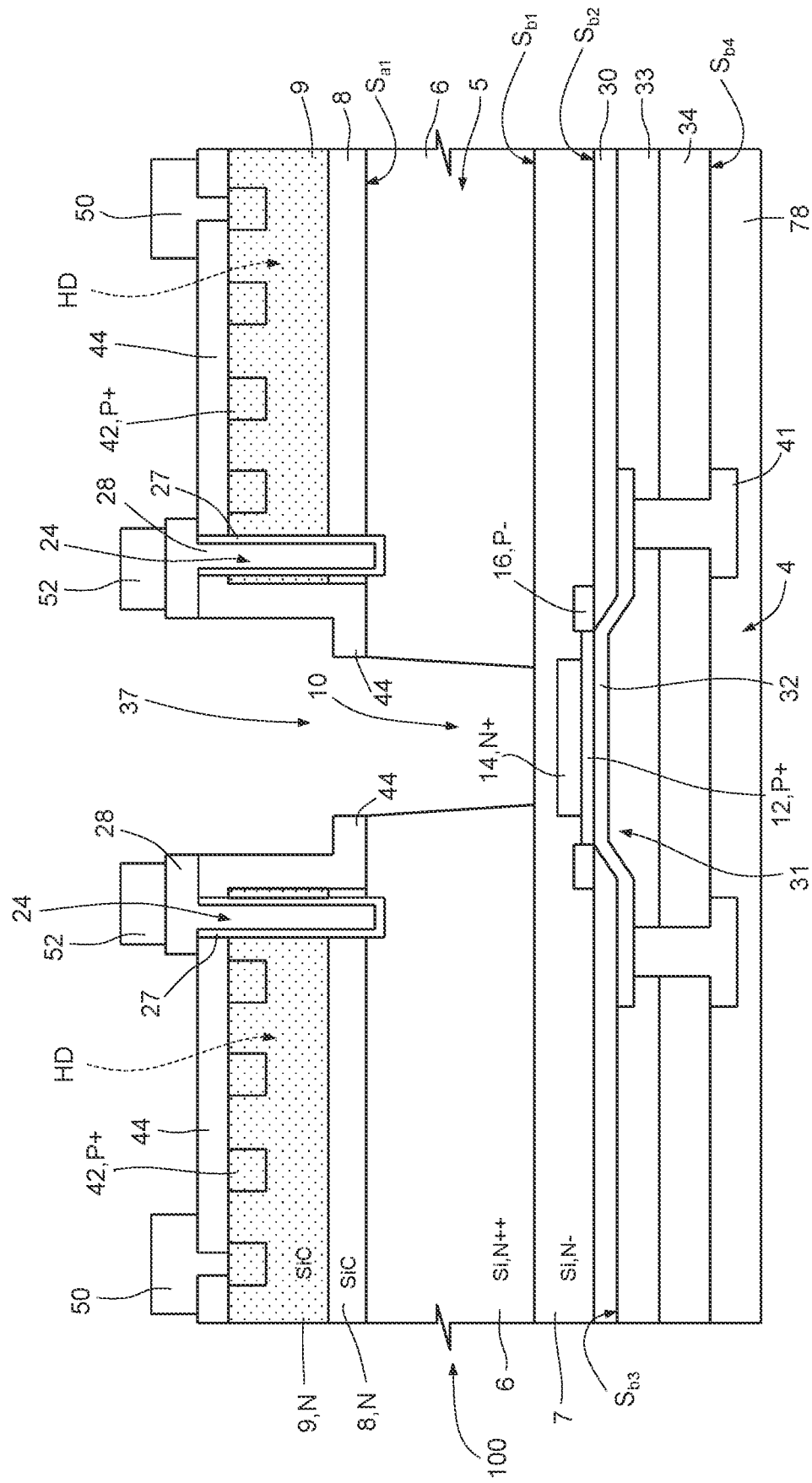

In FIG. 19, the effect in the substrate 6 of the aforementioned implantation of ions of atoms belonging to group IV or group VIII is not illustrated, for simplicity and considering the fact that, as shown in FIG. 20, a further selective wet etch is subsequently carried out in order to form the first cavity 10, via removal of a part of the top dielectric region 44 that coats the bottom of the second cavity 37 and of an underlying part of substrate 6, said part of substrate 6 having been previously involved in the aforementioned implantation of ions of atoms belonging to group IV or group VIII. For the same reasons, in FIG. 13 the effect, in this area, of the implantation represented by the arrows 77 has not been illustrated.

Next, the second dielectric protective layer 78 is removed (step not shown), and the manufacturing process proceeds in a way in itself known, for example with dicing operations.

Once again by way of example, the embodiment illustrated in FIG. 7 may be obtained by employing the manufacturing process described hereinafter.

Figure 21:
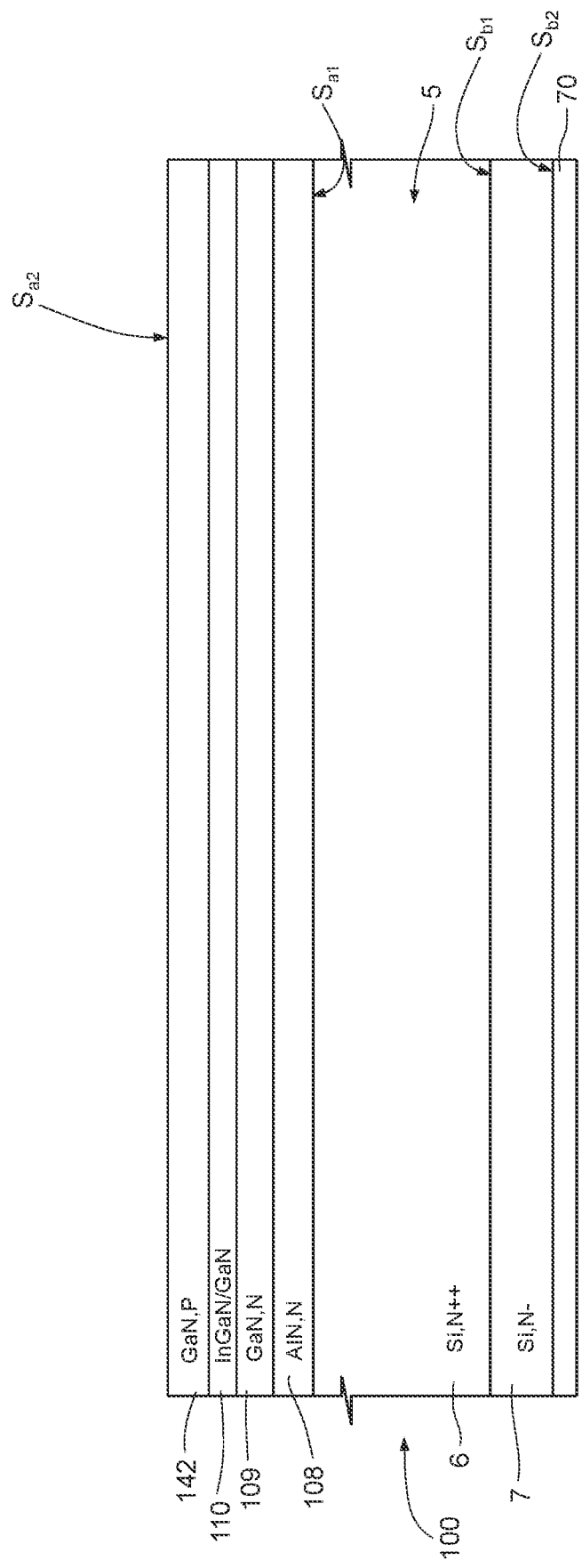
FIGS. 21-28 are schematic cross-sectional views of the device illustrated in FIG. 7, during successive steps of a manufacturing process.

Initially, the operations illustrated in FIG. 9 are carried out. Then, as illustrated in FIG. 21, formed, in a way in itself known and by means of epitaxial growth, are the buffer layer 108, the top epitaxial layer 109, the MQW structure 110, and the emitter anode region 142, which forms the second top surface $S_{a2}$.

Figure 22:
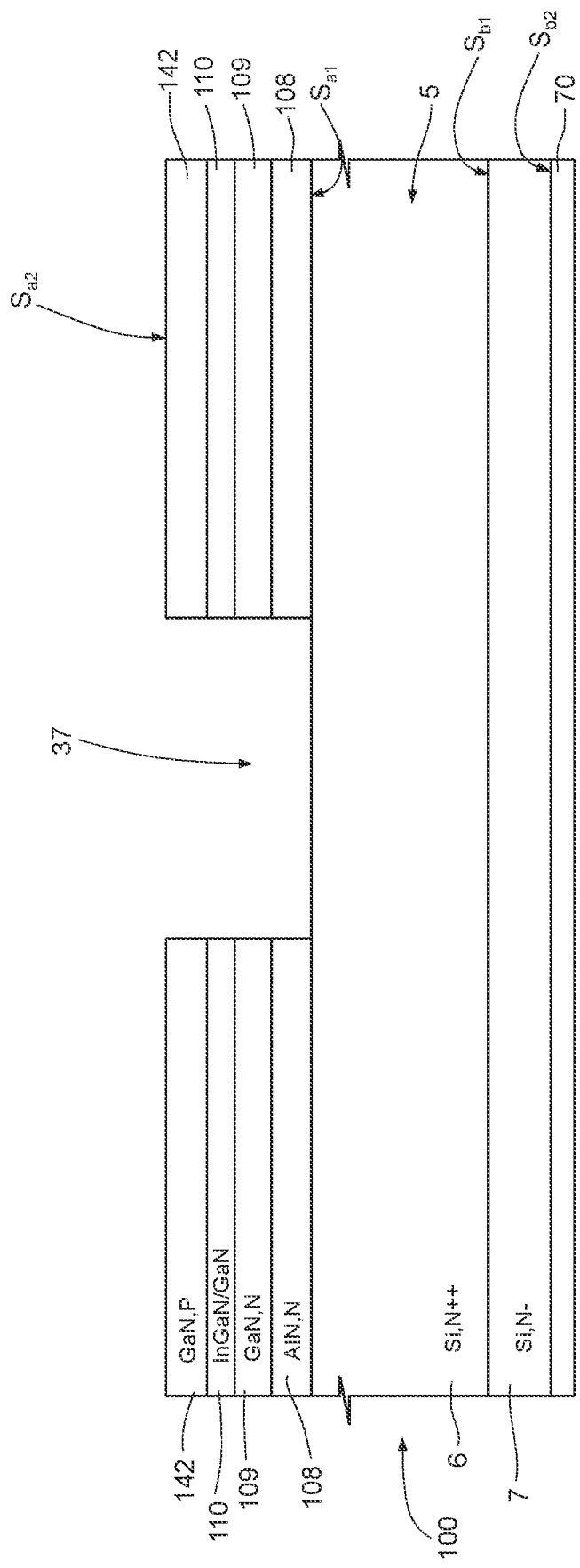

Next, as illustrated in FIG. 22, portions of the emitter anode region 142, of the MQW structure 110, of the top epitaxial layer 109, and of the buffer layer 108 are selectively removed so as to form the second cavity 37 and expose a portion of the substrate 6, which delimits the second cavity 37. For this purpose, a corresponding resist mask (not illustrated) may, for example, be provided on the second top surface $S_{a2}$, and a wet etch may subsequently be carried out.

Figure 23:
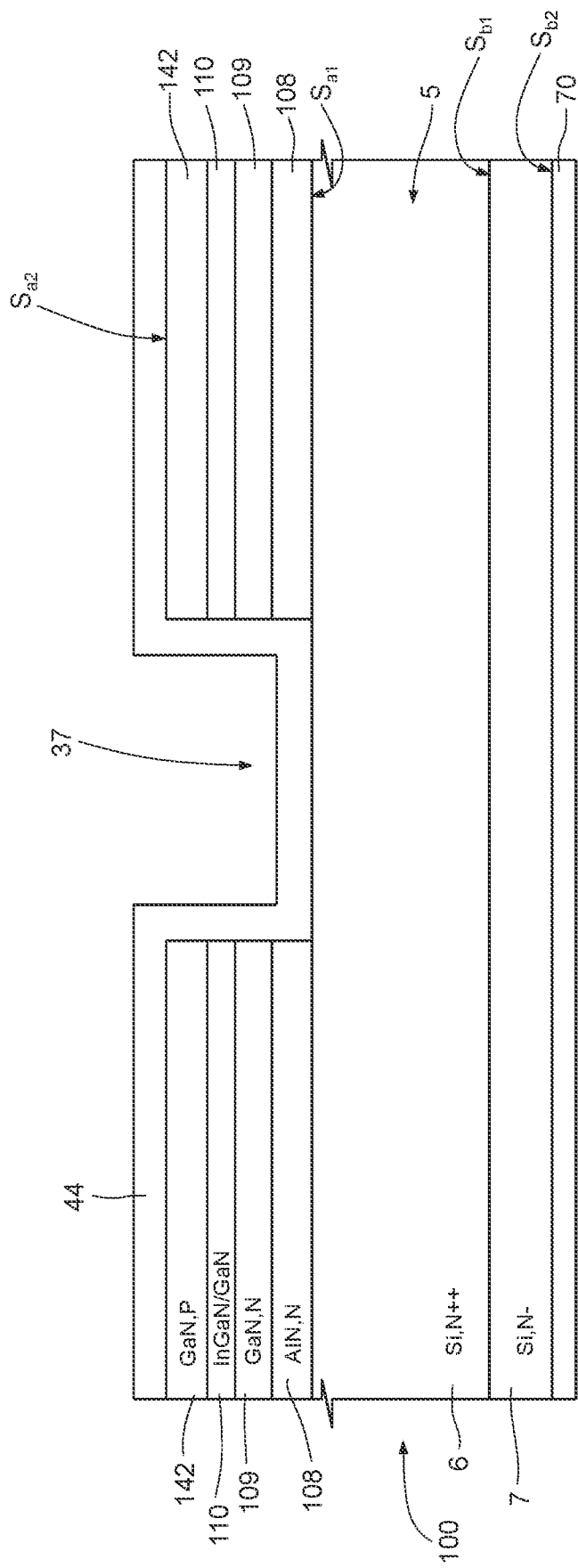

Next, as illustrated in FIG. 23, the top dielectric region 44 is formed, which extends on the second top surface $S_{a2}$ and moreover coats the side wall of the second cavity 37, as well as the exposed portion of the substrate 6.

Figure 24:
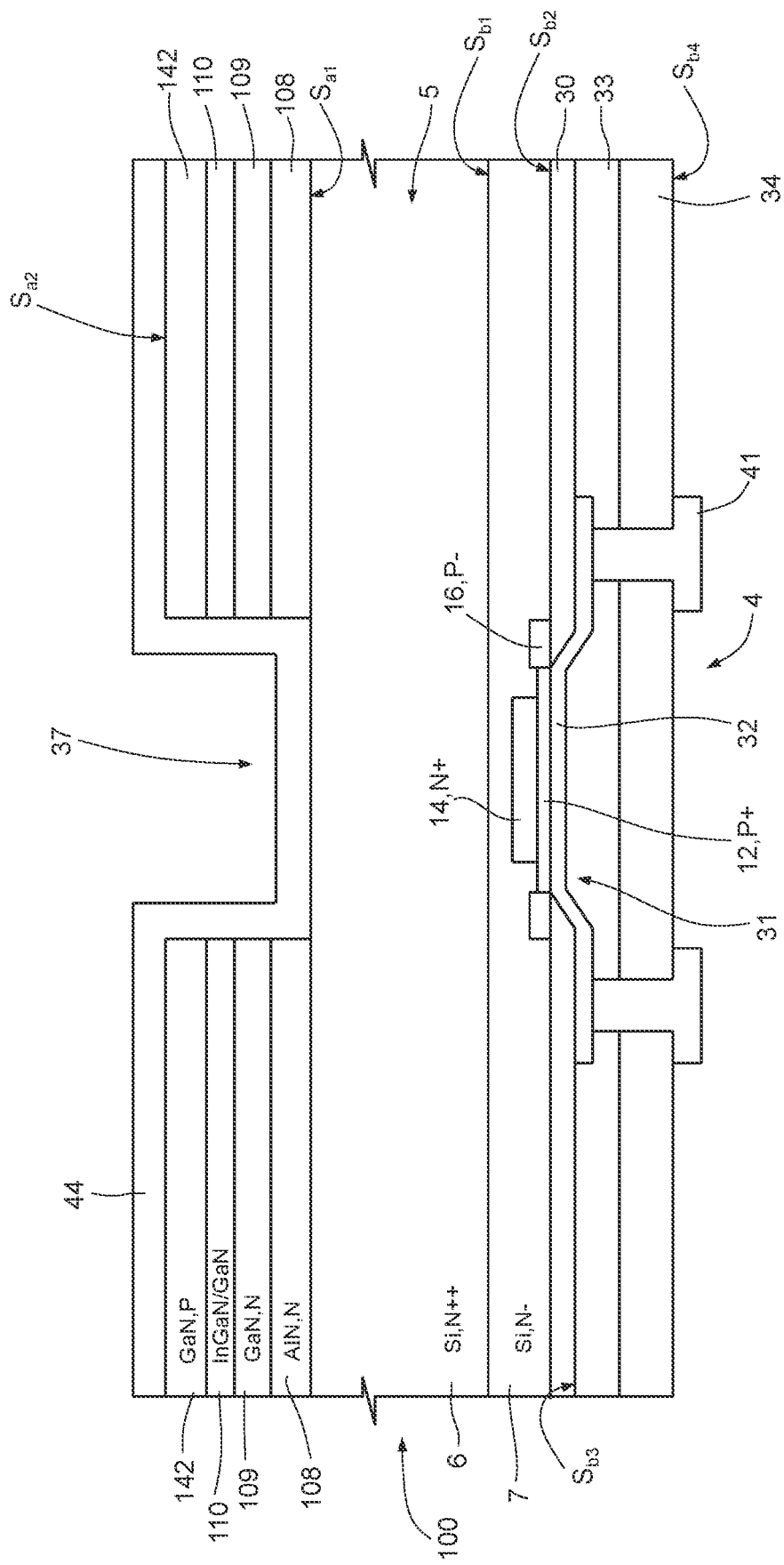

Then, in a way in itself known and consequently not illustrated or described in detail, the receiver 4 is formed by processing the die 100 from the back. In particular, as illustrated in FIG. 24, the first dielectric protective layer 70 is removed, and then the anode region 12, the enriched region 14, the guard ring 16, the first, second, and third bottom dielectric regions 30, 33, 34, the intermediate region 32, and the receiver anode metallization 41 are formed.

Figure 25:
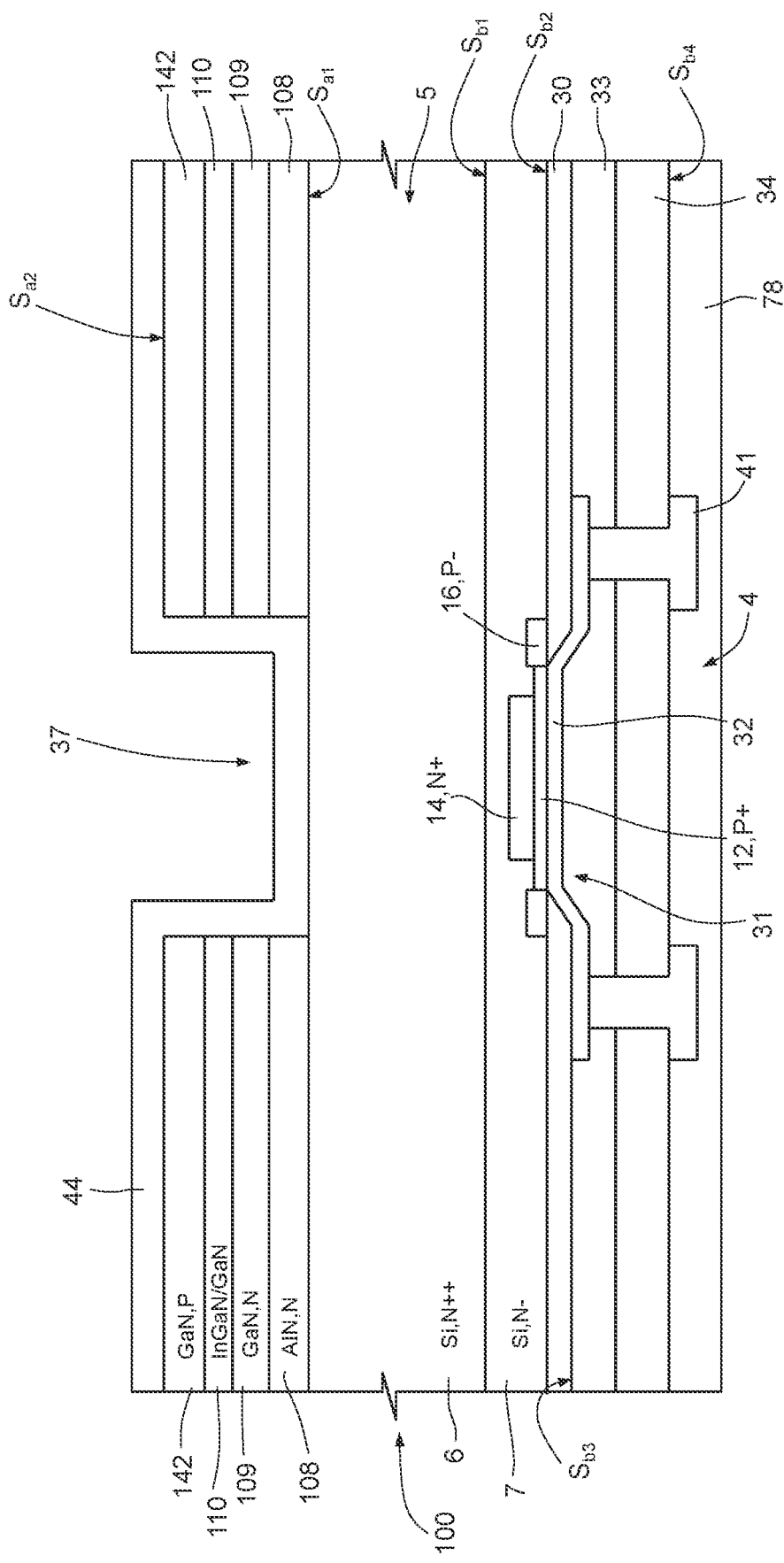

Then, as illustrated in FIG. 25, the second dielectric protective layer 78 is formed in contact with the fourth bottom surface $S_{b4}$.

Figure 26:
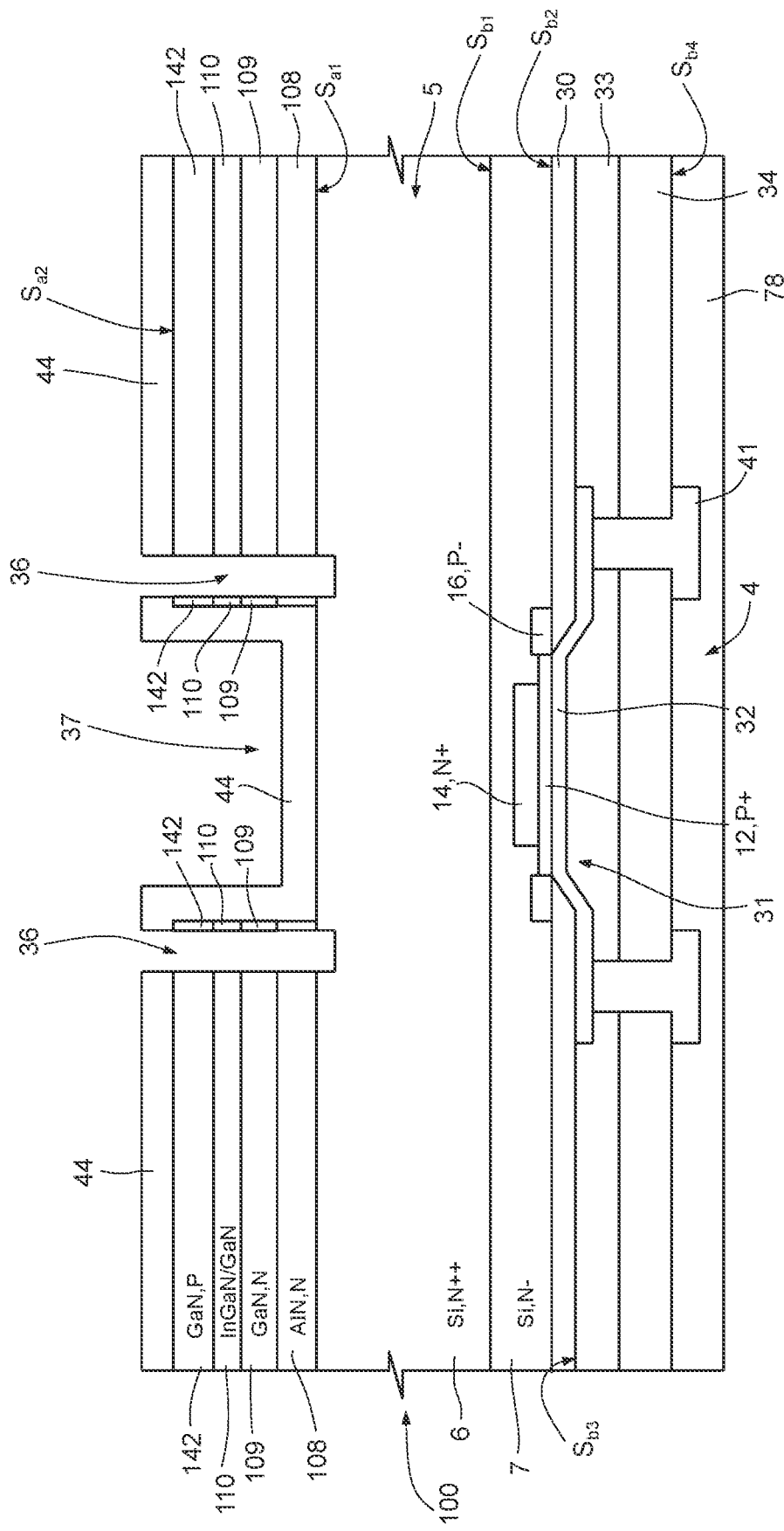

Next, as illustrated in FIG. 26, the trench 36 is formed by carrying out a first operation of selective etching of portions of the top dielectric region 44 and a second operation of selective etching of underlying portions of semiconductor material. These first and second etching operations may be carried out using one and the same mask (not illustrated), which is made, for example, of resist and is subsequently removed.

Figure 27:
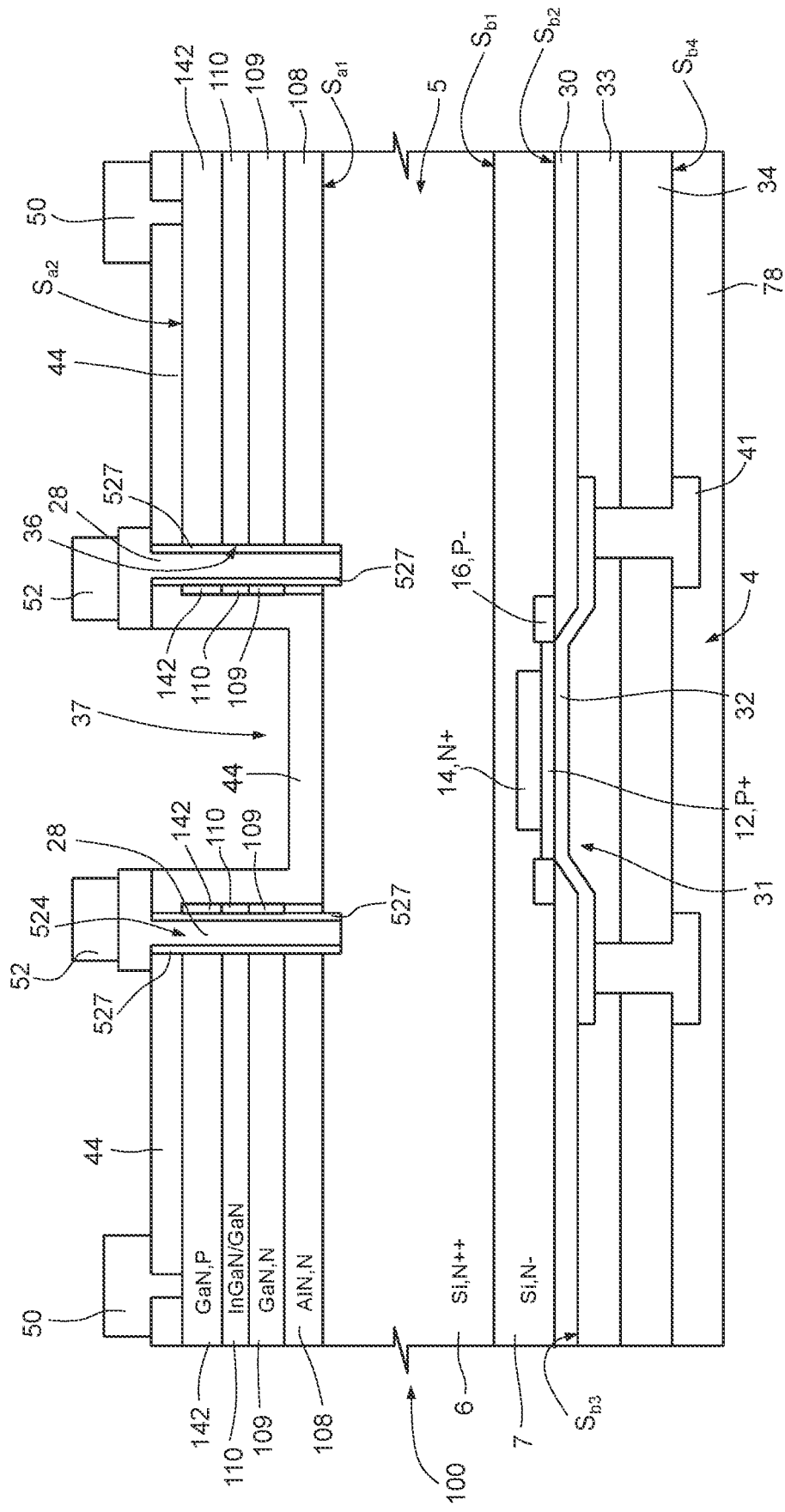

In a way not described in detail, the cathode-contact region 524, the emitter anode metallization 50, and the cathode metallization 52 are subsequently formed, as illustrated in FIG. 27.

Figure 28:
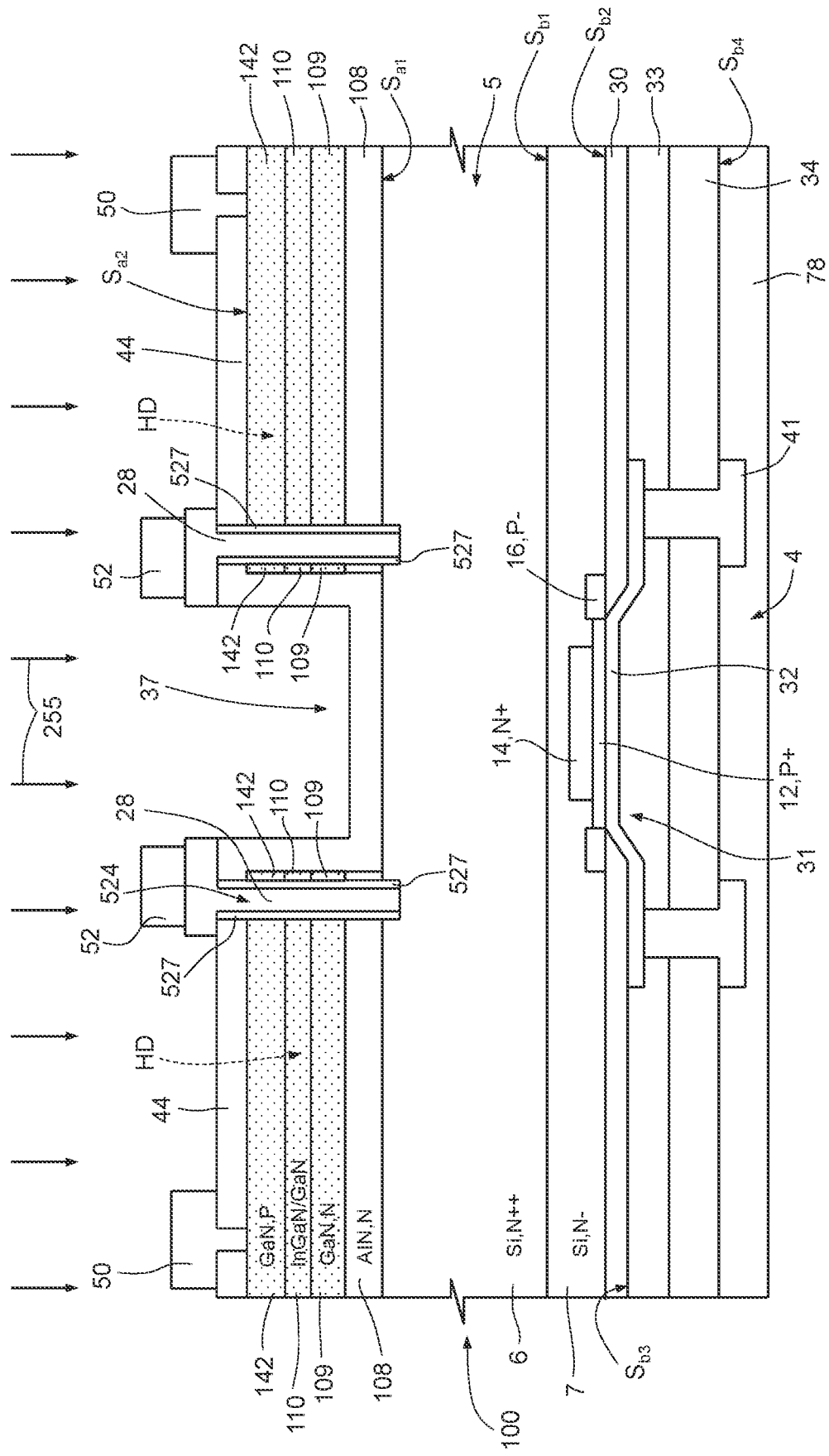

Then, as illustrated in FIG. 28, an ion implantation is carried out (represented schematically by the arrows 255) such as to create the area with high defectiveness HD. The implantation 255 is carried out with ions of atoms belonging to group IV or group VIII of the periodic table. For instance, there may be implanted ions of one or more from among argon, neon, and helium, with corresponding dosages and energy levels (for example, the ones mentioned in relation with the implantation indicated by the arrows 225).

Then, the manufacturing process continues as described with reference to the embodiment illustrated in FIG. 6.

As regards the embodiment illustrated in FIG. 8, it can be obtained in the same way as the embodiment illustrated in FIG. 7, but for the following differences. The MQW structure 110 is not present. Moreover, the emitter anode region 242 is formed by implantation, for example of ions of magnesium, with a dosage level of $3 \cdot 10^{14}$ cm$^{-2}$ and an energy of 100 keV. Next, a thermal treatment is carried out at approximately 1150° C. and for a duration of approximately 1 h.

The advantages that the present optoelectronic device affords emerge clearly from the foregoing description. In particular, the present optoelectronic device integrates an optical source made of a wide-band-gap semiconductor material and a SPAD made of a different semiconductor material, which are characterized by high efficiency levels, in particular in the near infrared.

Moreover, the semiconductor heterostructure described is compatible with the so-called CMOS processes and can be miniaturized, as well as being conveniently packaged.

Once again, lattice coupling between silicon and materials with wide band gap is better than traditional III-V emitters.

In addition, the presence of the first cavity 10 on the receiver 4 means that it is not necessary to insert an intrinsic semiconductor layer that will absorb photons between the anode and the cathode of the receiver 4, which would cause an increase in the breakdown voltage $V_B$.

The present optoelectronic device moreover represents a device with three terminals, in which the emitter and the receiver are in any case electrically and optically uncoupled.

Finally, it is clear that modifications and variations may be made to the optoelectronic device and the manufacturing process described and illustrated herein, without thereby departing from the sphere of protection of the present disclosure.

For instance, as mentioned previously, the receiver can operate in avalanche mode, but not in Geiger mode.

Moreover, embodiments of the type illustrated in FIGS. 1, 3, 5, 6, and 8 are possible, but in which the cathode-contact region is of the type illustrated in FIGS. 4 and 7.

It is moreover possible to modify the manufacturing process so as to locate the vacancies in just the cathode region of the emitter junction.

In general, it is moreover possible to use semiconductor materials different from the ones described. However, the use of semiconductor materials with a band gap wider than 2.3 eV favors use of the emitter as SPLE (as well as generator of blue/ultraviolet radiation) in so far as it makes it possible to have available a wide energy range in which to provide, by means of the aforementioned vacancies, intermediate energy levels. On the other hand, a good SPLE behavior is obtained also in the case where only part of the emitter is made of semiconductor material with wide band gap. For instance, in the case where the MQW structure is present, some layers may be made of semiconductor with narrower band gap.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a semiconductor body;
   a first cathode structure that includes a first semiconductor material of the semiconductor body and has a first type of conductivity;
   a buffer region on the first cathode structure and including a second semiconductor material of the semiconductor body that is different from the first semiconductor material;
   a receiver including a receiver anode region in the first semiconductor material, having a second type of conductivity, and extending in the first cathode structure; and
   an emitter on the buffer region and including a semiconductor junction, the semiconductor junction including:
   a second cathode structure on the buffer region; and
   an emitter anode structure disposed on the second cathode structure.

2. The device of claim 1,
   wherein the semiconductor junction is formed at least in part by a third semiconductor material, different from the first semiconductor material.

3. The device of claim 2, wherein the second cathode structure has the first type of conductivity; and the emitter anode structure has the second type of conductivity.

4. The device of claim 3, wherein:
   the third semiconductor material has a band gap wider than or equal to 2.3 eV; and
   at least one part of the second cathode structure is in contact with the emitter anode structure, is formed by the third semiconductor material, and has vacancies in its crystalline structure, due to non-bound ions or atoms of group IV or group VIII of the periodic table.

5. The device of claim 4, wherein the vacancies have a concentration higher than a mean value of concentration of vacancies present in the buffer region.

6. The device of claim 5, wherein the vacancies in said at least one part of the second cathode structure have a concentration of at least $10^{13}$ atoms/cm$^{-3}$.

7. The device of claim 4, wherein the emitter anode structure has a doping level higher than a doping level of the at least one part of the second cathode structure.

8. The device of claim 4, wherein the emitter is a single-photon light emitter.

9. The device of claim 3, wherein:
   the third semiconductor material is the same material as the buffer semiconductor material;
   the second cathode structures includes a top epitaxial layer, which is formed by the buffer semiconductor material, has the first type of conductivity, is arranged on the buffer region, and is has a top surface; and
   the emitter anode structure is formed by the buffer semiconductor material and extends in the top epitaxial layer, starting from the top surface.

10. The device of claim 3, further comprising a dielectric layer, the receiver anode region extending over a recess in the dielectric layer.

11. The device of claim 10, further comprising an intermediate layer between the dielectric layer and the receiver anode region, the intermediate layer coating at least a portion of the recess in the dielectric layer.

12. The device of claim 11, further comprising a receiver anode metallization that contacts the intermediate layer.

13. A device, comprising:
   a first semiconductor structure of a first semiconductor material and a first conductivity type;
   a second semiconductor structure of a second semiconductor material on the first semiconductor structure, the second semiconductor material being a wide band gap material that is different from the first semiconductor material; and
   a receiver configured to receive and detect photons, the receiver being formed in the first semiconductor structure and including a semiconductor junction formed by a cathode region of the first conductivity type and an anode region of a second conductivity type.

14. The device of claim 13, wherein the second semiconductor structure includes:
   a buffer region on the first semiconductor structure; and
   an epitaxial layer on the buffer region and including the cathode region.

15. A device, comprising:
   a cathode region of a first semiconductor material of a first conductivity type;

a receiver anode region of the first semiconductor material embedded in the cathode region and including a second conductivity type;

a buffer region on the first cathode region and including a second semiconductor material different from the first semiconductor material;

an emitter anode region of a third semiconductor material of the second conductivity type on the buffer region;

a top epitaxial layer on the buffer region; and a multi-quantum-well structure on the top epitaxial layer.

16. The device of claim 15, wherein the emitter anode region includes first and second concentric rings.

17. The device of claim 16, wherein the emitter anode region includes a linear segment connecting the first and second concentric rings.

18. The device of claim 15, wherein the third semiconductor material has a band gap wider than or equal to 2.3 eV and includes non-bound dopant atoms of group IV or group VIII of the periodic table.

19. The device of claim 18, wherein the third semiconductor material has vacancies in a crystalline structure of at least one part of a second cathode structure.

20. The device of claim 15, wherein the top epitaxial layer is of the third semiconductor material of the first conductivity type.

* * * * *